United States Patent
Jeong et al.

(10) Patent No.: US 10,770,467 B2
(45) Date of Patent: Sep. 8, 2020

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Soo-Yeon Jeong, Hwaseong-si (KR); Dong-Gu Yi, Seoul (KR); Tae-Jong Lee, Hwaseong-si (KR); Jae-Po Lim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/196,197

(22) Filed: Nov. 20, 2018

(65) Prior Publication Data

US 2019/0088662 A1 Mar. 21, 2019

Related U.S. Application Data

(63) Continuation of application No. 15/344,834, filed on Nov. 7, 2016, now Pat. No. 10,163,913, which is a (Continued)

(30) Foreign Application Priority Data

Sep. 3, 2014 (KR) ........................ 10-2014-0117063

(51) Int. Cl.
*H01L 27/11* (2006.01)
*H01L 27/088* (2006.01)
(Continued)

(52) U.S. Cl.
CPC .. *H01L 27/1104* (2013.01); *H01L 21/823814* (2013.01); *H01L 21/823821* (2013.01);
(Continued)

(58) Field of Classification Search
None
See application file for complete search history.

(56) References Cited

U.S. PATENT DOCUMENTS 7,394,116 B2 7/2008 Kim et al.
8,373,238 B2 2/2013 Lee et al.
(Continued)

OTHER PUBLICATIONS

"Semiconductor Device and Method for Fabricating the Same" Specification, Drawings, and Prosecution History, of U.S. Appl. No. 14/570,303, filed Jun. 25, 2015, now U.S. Patent No. 9,490,258, issued Nov. 8, 2016, by Soo-Yeon Jeong, et al., which is stored in the United States Patent and Trademark Office (USPTO).
(Continued)

*Primary Examiner* — Shaun M Campbell
(74) *Attorney, Agent, or Firm* — Onello & Mello, LLP

(57) ABSTRACT

Provided are a semiconductor device and a method for fabricating the same. The semiconductor device comprises a first fin type active pattern formed on a substrate and extending in a first direction and including first to third parts. At least one dimension of the third part measuring less than the corresponding dimension of the first part. A gate electrode extending in a second direction different from the first direction is at least partially formed on the first part of the fin type active pattern. A first source/drain is formed on the third part of the fin type active pattern.

13 Claims, 25 Drawing Sheets

Related U.S. Application Data continuation of application No. 14/750,303, filed on Jun. 25, 2015, now Pat. No. 9,490,258.

(51) Int. Cl.

| | | |
|---|---|---|
| *H01L 29/40* | (2006.01) | |
| *H01L 29/08* | (2006.01) | |
| *H01L 29/66* | (2006.01) | |
| *H01L 29/78* | (2006.01) | |
| *H01L 21/8238* | (2006.01) | |
| *H01L 27/092* | (2006.01) | |
| *H01L 21/8234* | (2006.01) | |

(52) U.S. Cl.
CPC .. *H01L 21/823828* (2013.01); *H01L 27/0886* (2013.01); *H01L 27/0924* (2013.01); *H01L 27/1116* (2013.01); *H01L 29/0847* (2013.01); *H01L 29/408* (2013.01); *H01L 29/66545* (2013.01); *H01L 29/66636* (2013.01); *H01L 29/66795* (2013.01); *H01L 29/785* (2013.01); *H01L 21/823418* (2013.01); *H01L 21/823431* (2013.01); *H01L 29/7848* (2013.01)

(56) References Cited

U.S. PATENT DOCUMENTS

| | | |
|---|---|---|
| 8,901,615 B2 | 12/2014 | Moroz |
| 8,987,100 B2 | 3/2015 | Oh et al. |
| 9,490,258 B2 | 11/2016 | Jeong et al. |
| 2005/0062088 A1 | 3/2005 | Houston |
| 2005/0112851 A1 | 5/2005 | Lee et al. |
| 2007/0145487 A1 | 6/2007 | Kavalieros et al. |
| 2008/0048262 A1* | 2/2008 | Lee .................. H01L 29/41791 257/347 |
| 2008/0157225 A1 | 7/2008 | Datta et al. |
| 2009/0026519 A1 | 1/2009 | Jin et al. |
| 2009/0095980 A1* | 4/2009 | Yu .................... H01L 29/66795 257/190 |
| 2010/0171181 A1 | 7/2010 | Rhee et al. |
| 2011/0147842 A1 | 6/2011 | Cappellani et al. |
| 2011/0210393 A1 | 9/2011 | Chen et al. |
| 2013/0043536 A1 | 2/2013 | Rahim et al. |
| 2013/0154029 A1* | 6/2013 | Cai ................... H01L 29/66795 257/402 |
| 2013/0171791 A1* | 7/2013 | Shima ................. H01L 29/0634 438/286 |
| 2013/0171794 A1 | 7/2013 | Pei et al. |
| 2013/0175611 A1 | 7/2013 | Shinohara et al. |
| 2013/0244392 A1* | 9/2013 | Oh .................... H01L 29/66477 438/299 |
| 2013/0270652 A1 | 10/2013 | Liaw |
| 2013/0285143 A1 | 10/2013 | Oh et al. |
| 2013/0334606 A1 | 12/2013 | Shen et al. |
| 2013/0334613 A1 | 12/2013 | Moroz |
| 2015/0035046 A1* | 2/2015 | Kim .................. H01L 29/42392 257/327 |
| 2015/0228722 A1 | 8/2015 | Chung et al. |
| 2015/0303118 A1* | 10/2015 | Wang .............. H01L 21/823481 257/401 |
| 2016/0064387 A1 | 3/2016 | Jeong et al. |

OTHER PUBLICATIONS

"Semiconductor Device and Method for Fabricating the Same" Specification, Drawings, and Prosecution History, of U.S. Appl. No. 15/344,834, filed Nov. 7, 2016, by Soo-Yeon Jeong, et al., which is stored in the United States Patent and Trademark Office (USPTO).

* cited by examiner

[Fig 1]
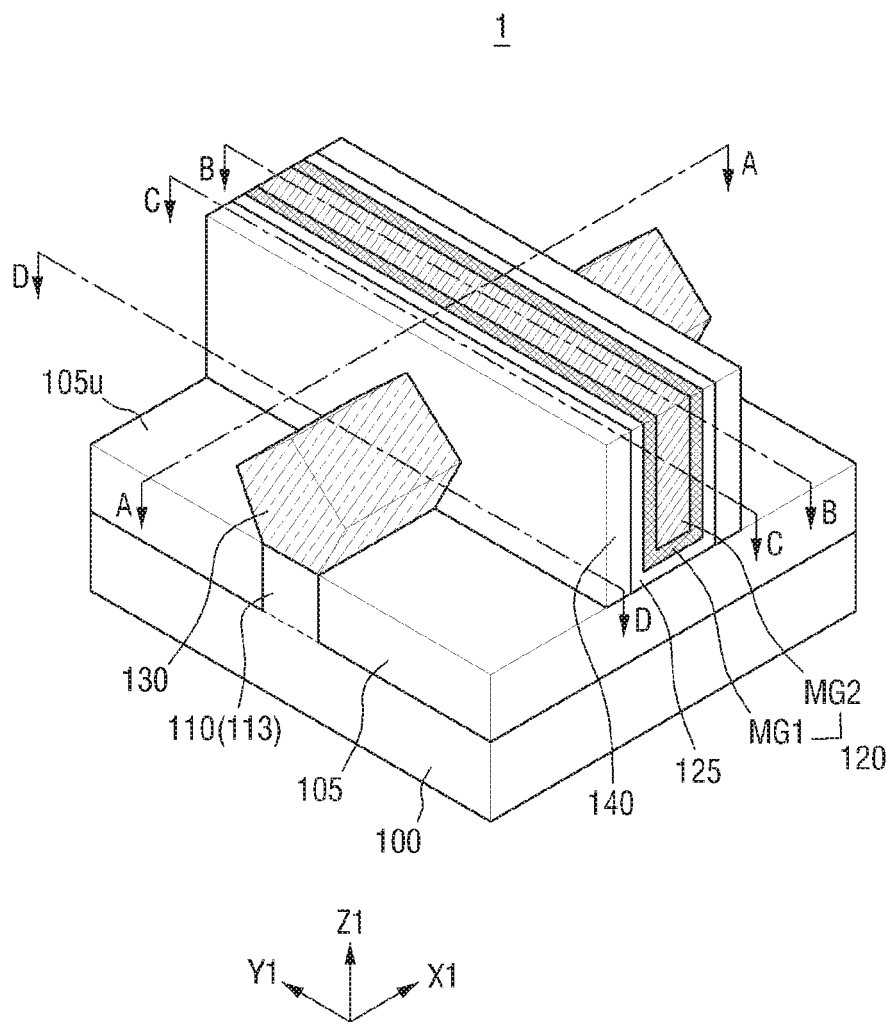

[Fig 2]
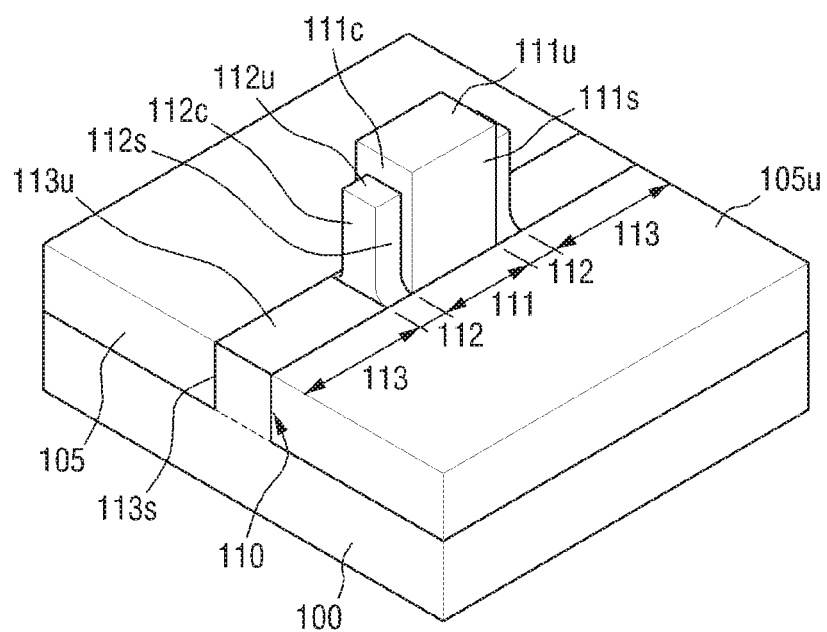

[Fig 3]
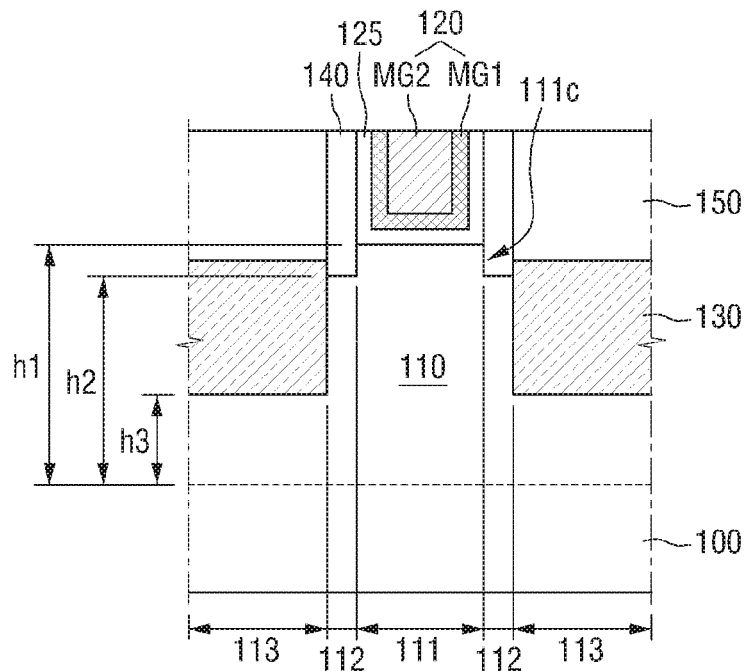
[Fig 4]
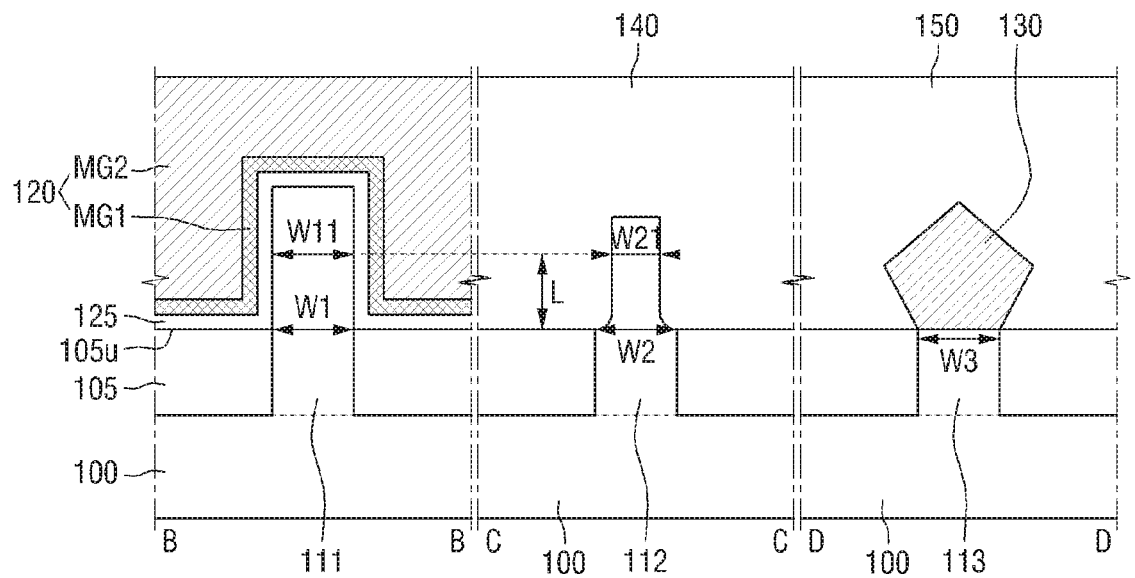

[Fig 5]
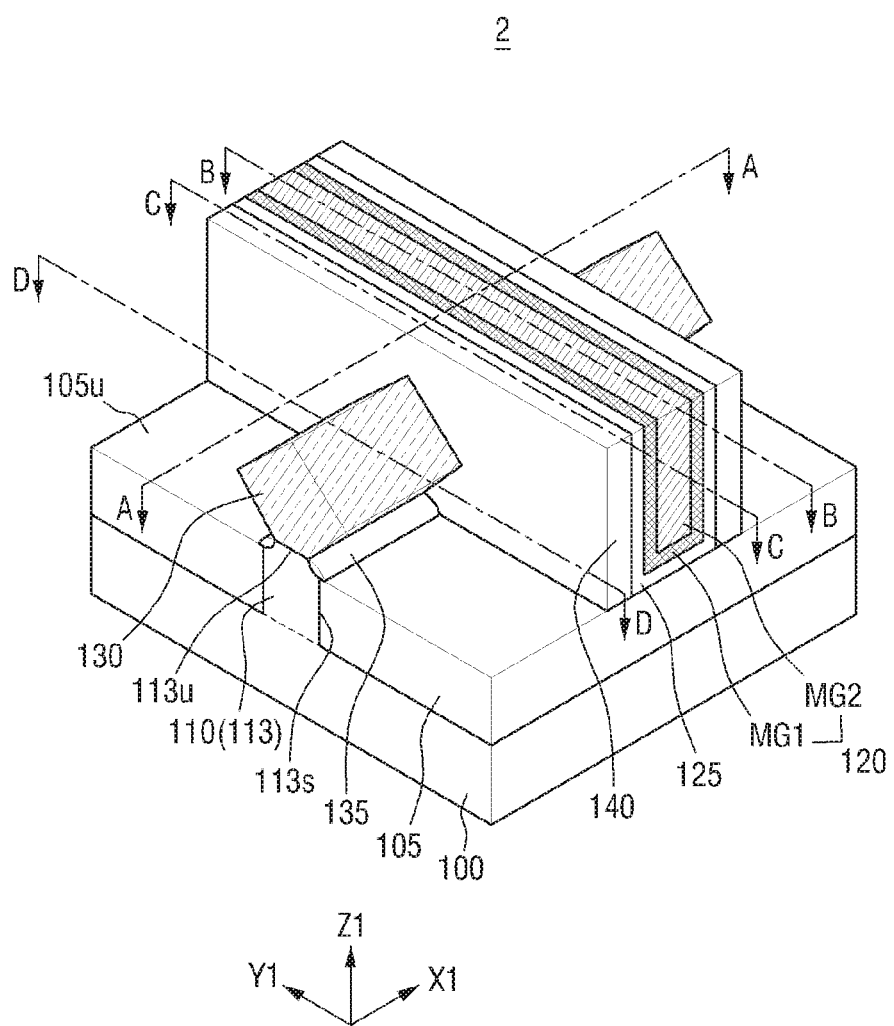

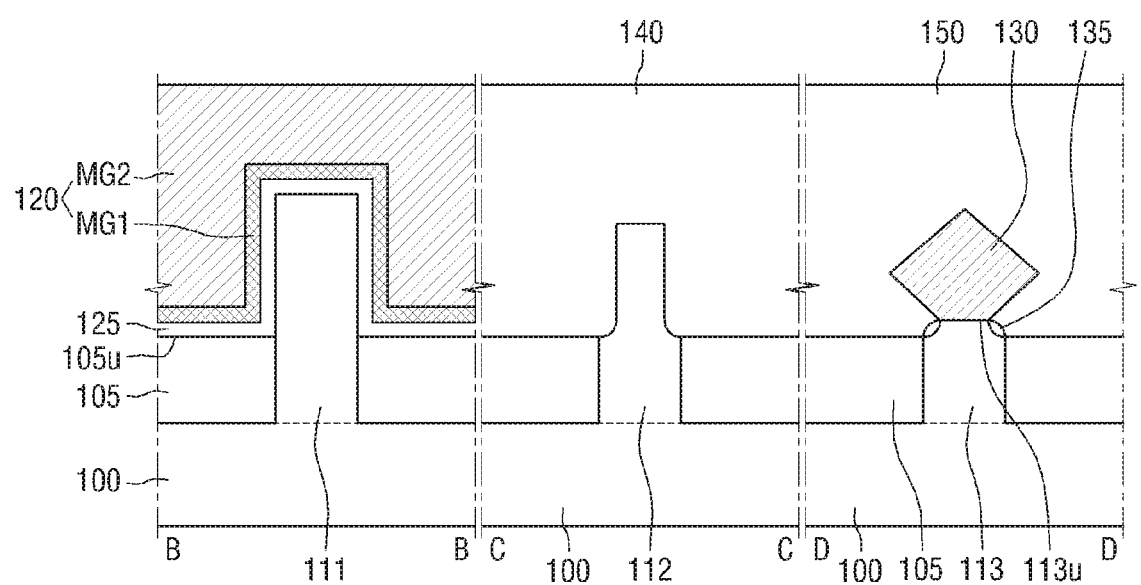
[Fig 6]

[Fig 7]
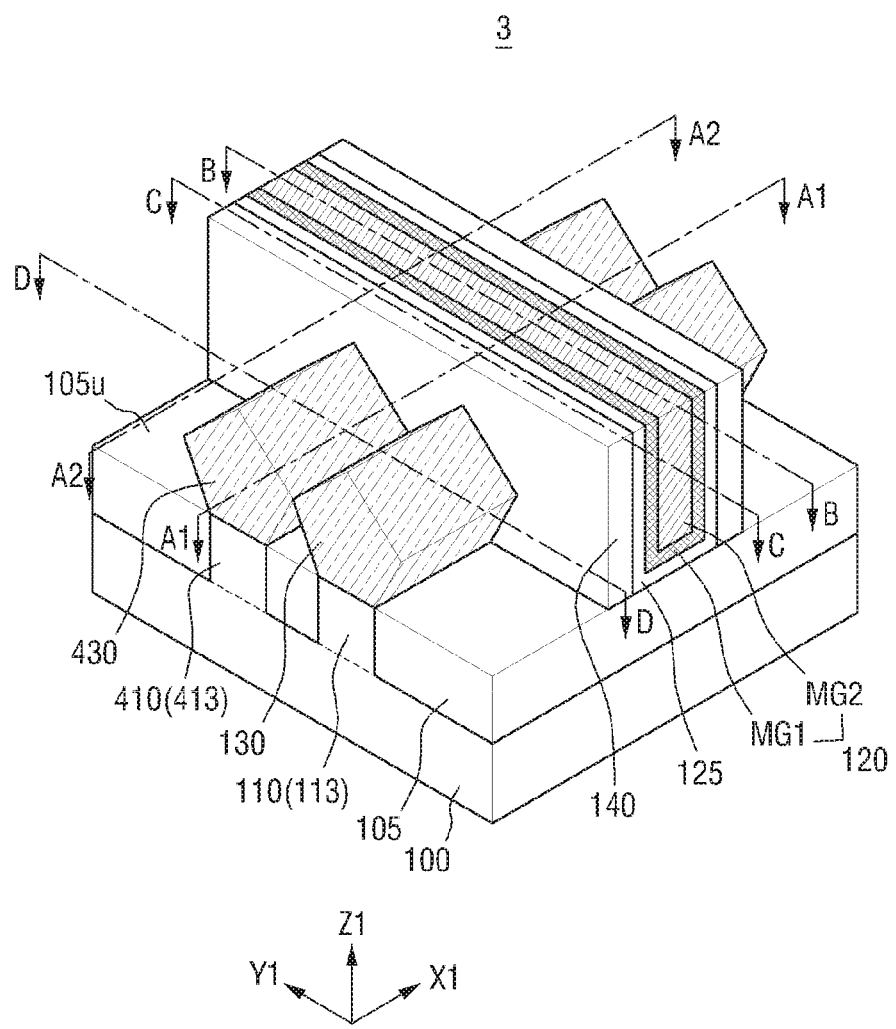

[Fig 8]
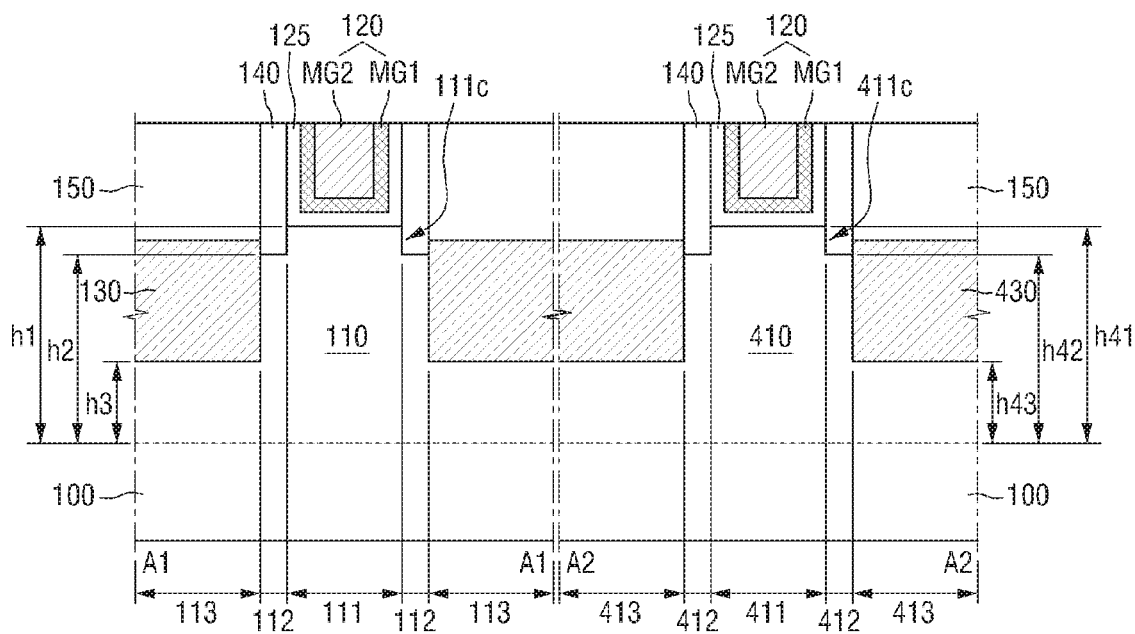
[Fig 9]
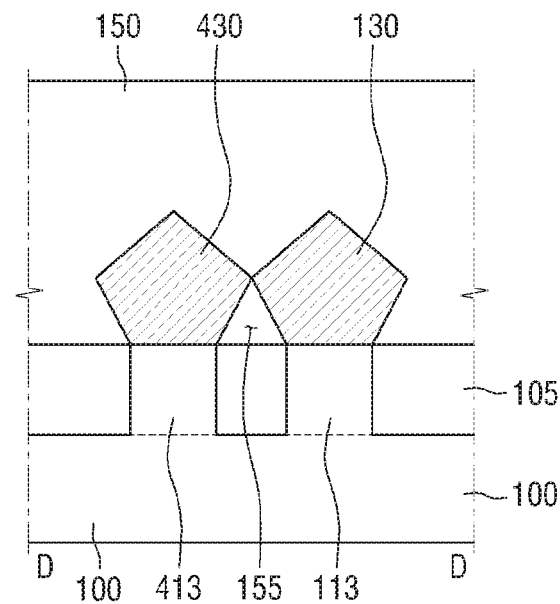

[Fig 10]
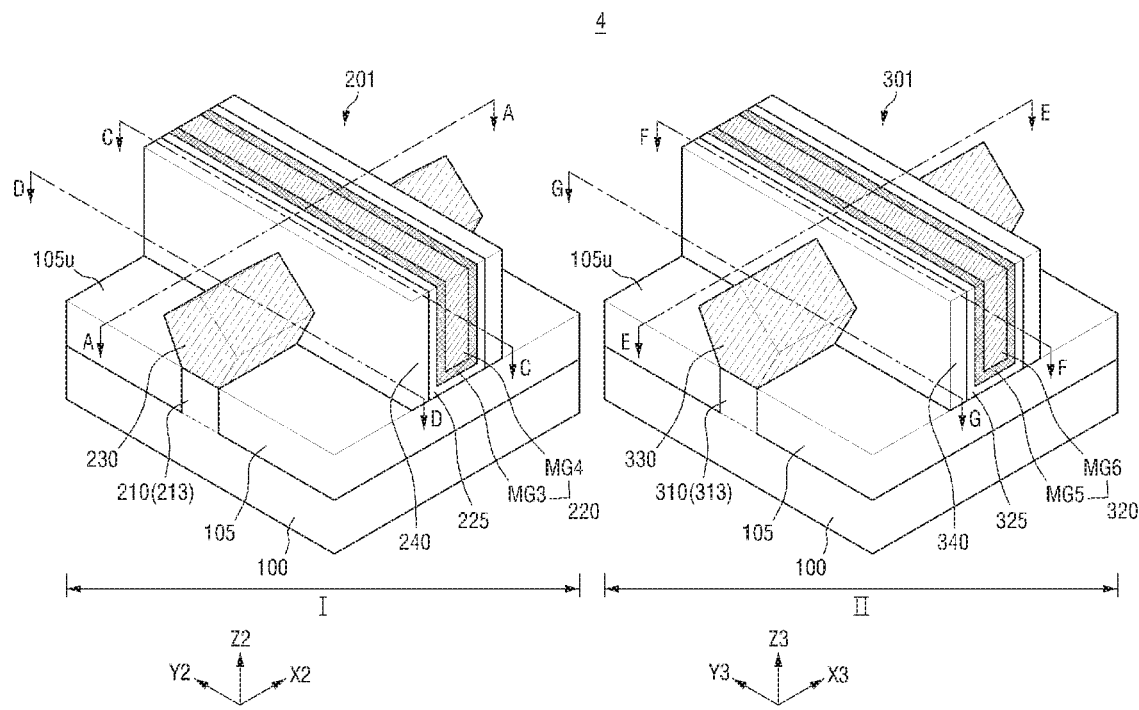
[Fig 11]
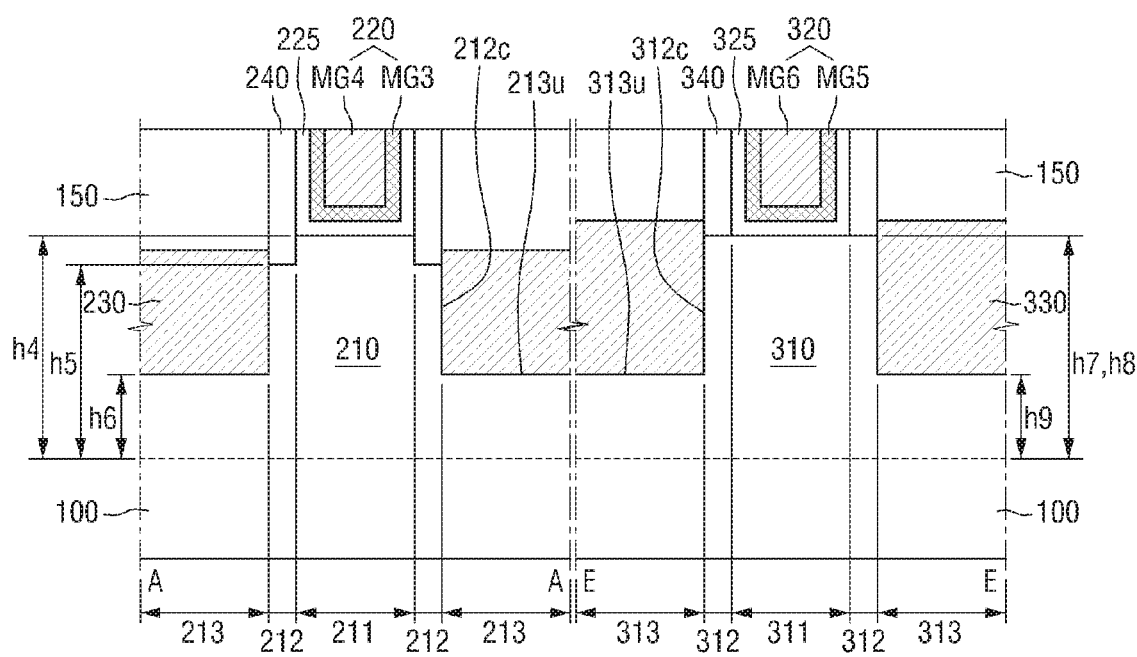

[Fig 12]
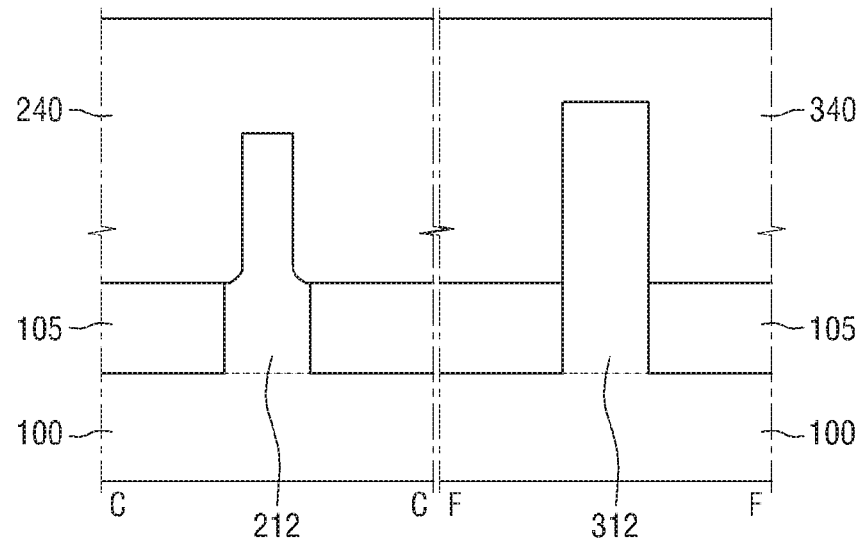
[Fig 13]
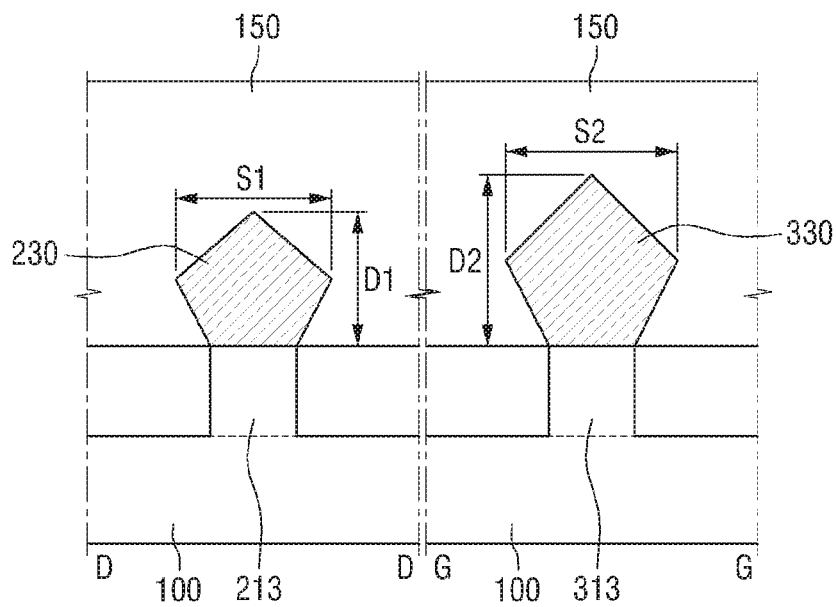

[Fig 14]
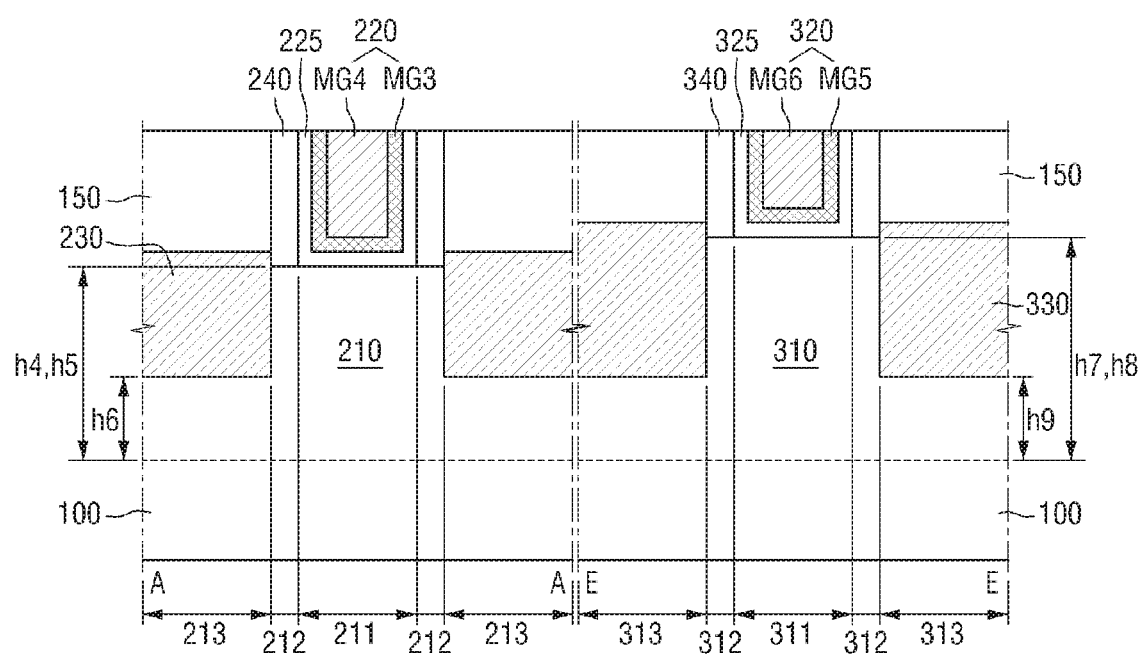

[Fig 15]
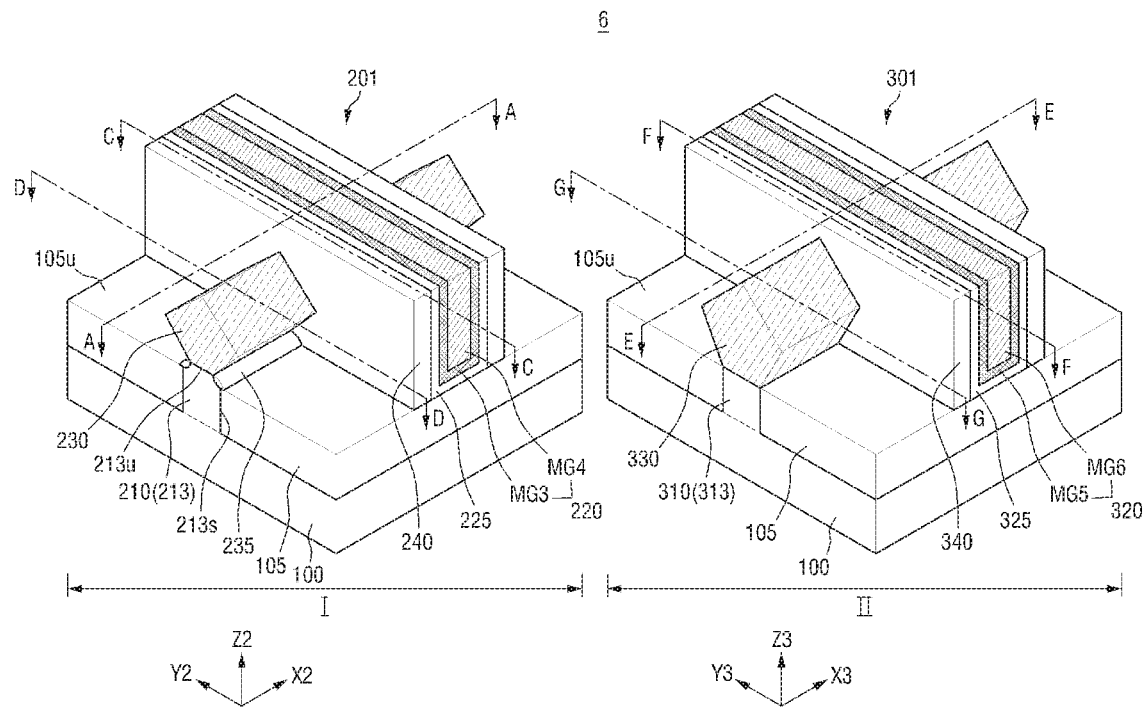
[Fig 16]
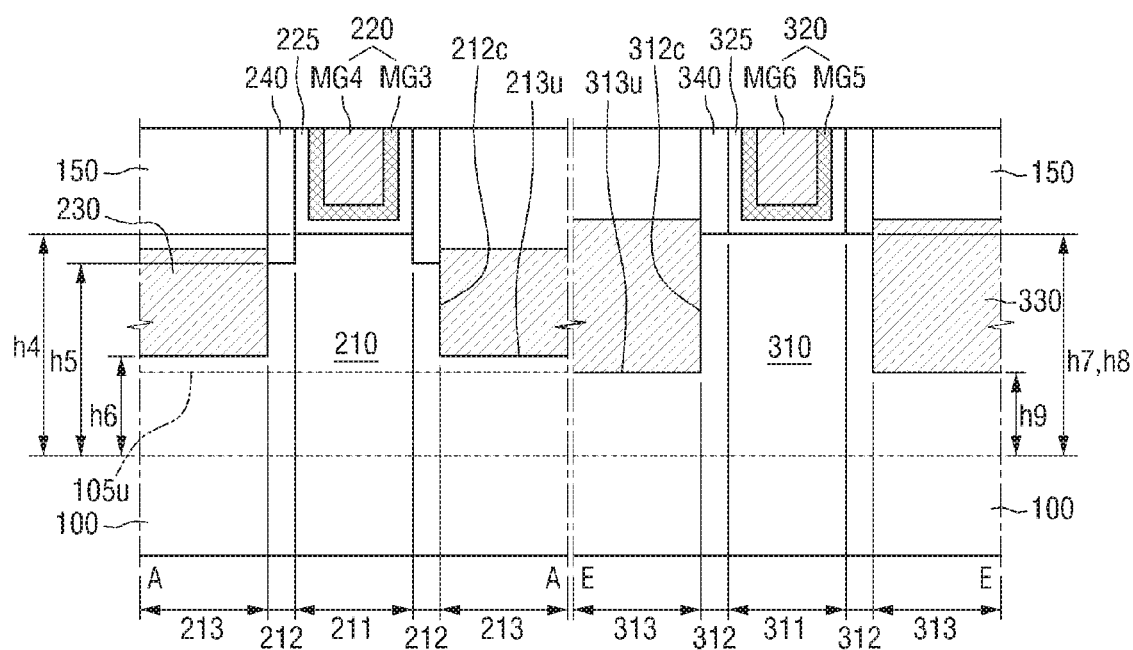

[Fig 17]
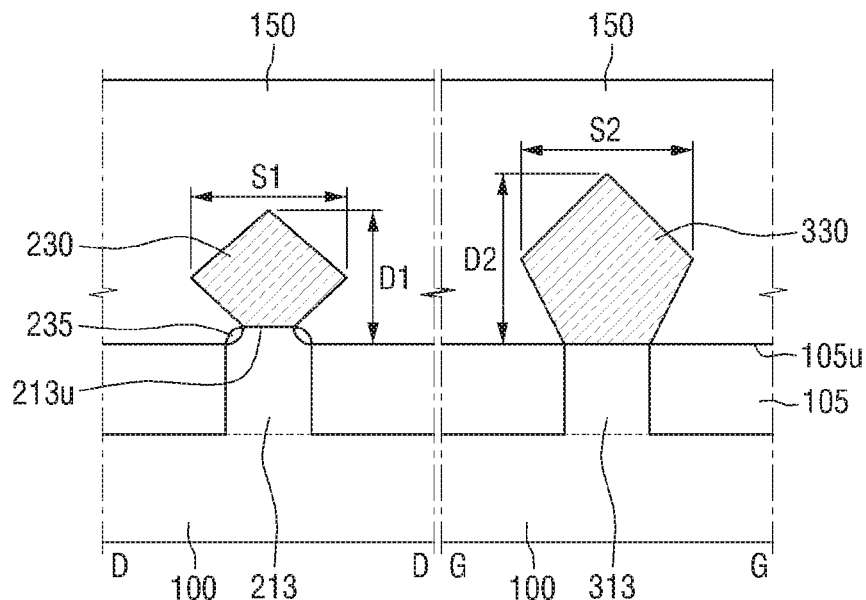
[Fig 18]
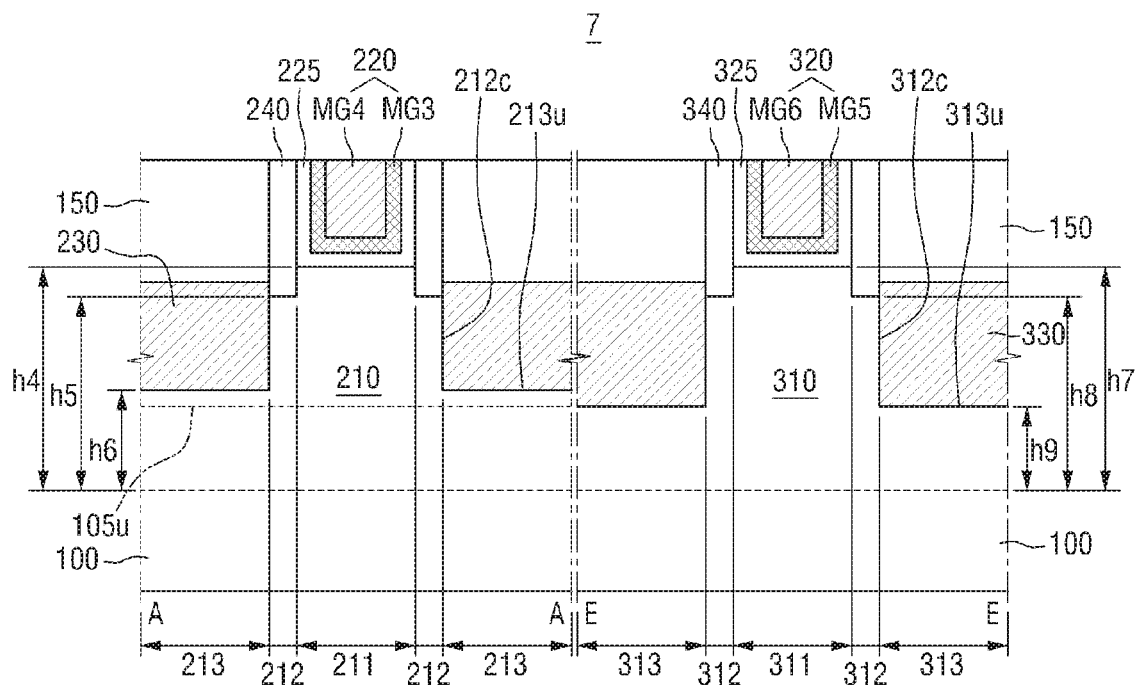

[Fig 19]
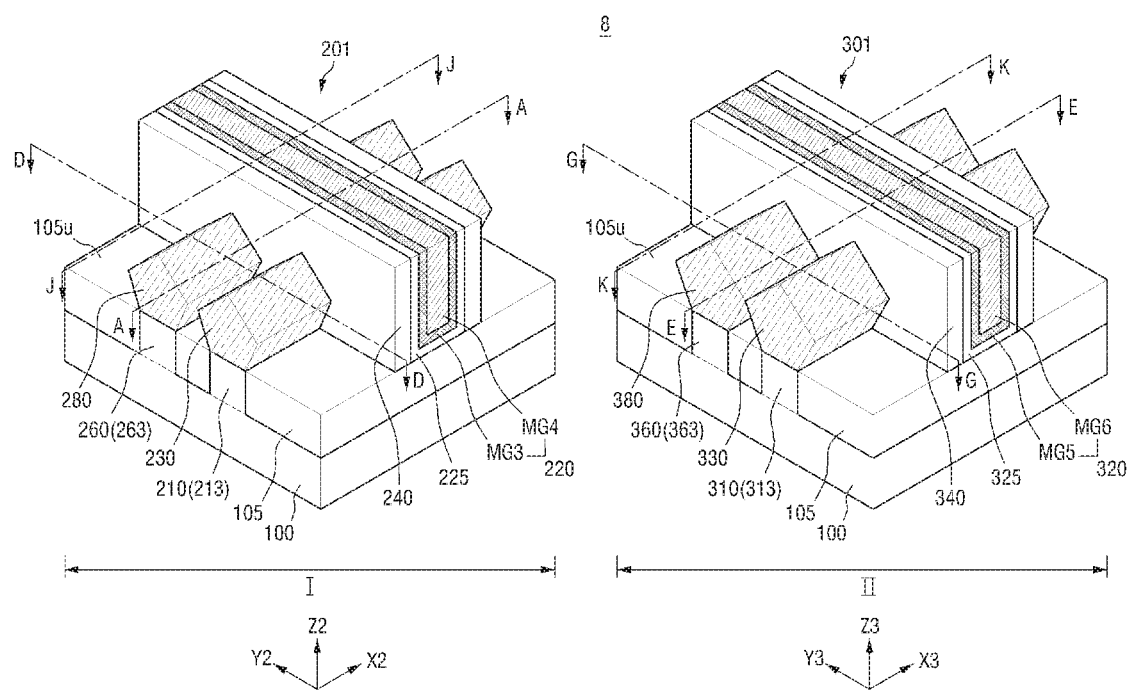

[Fig 20]
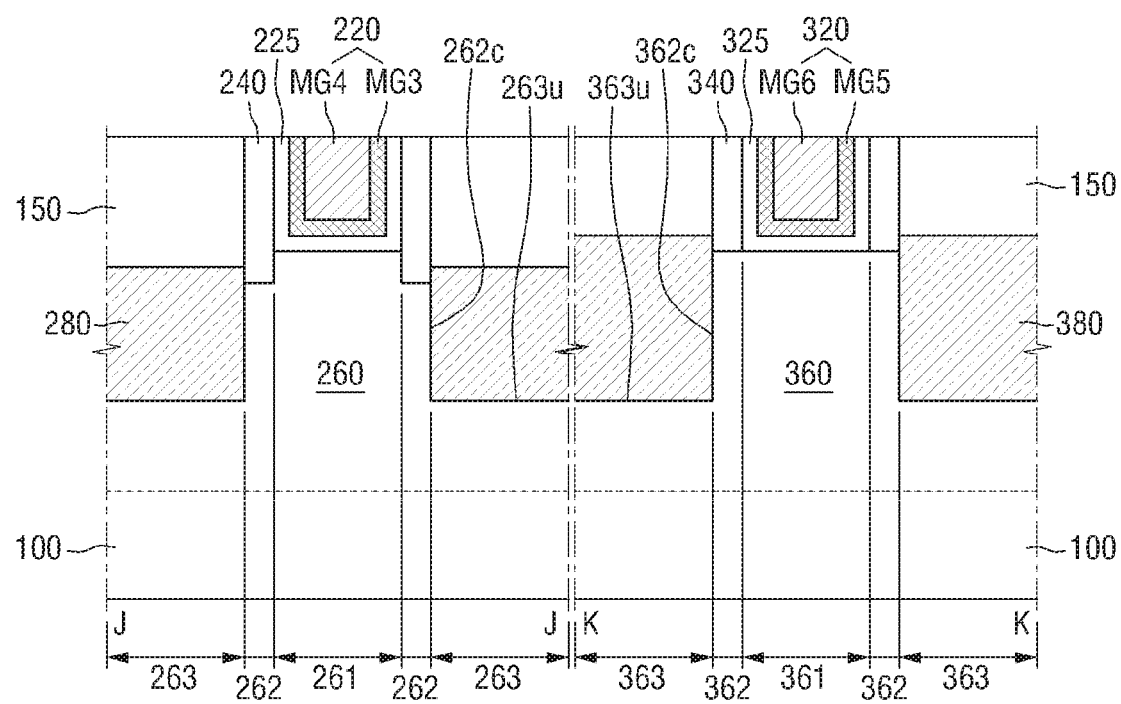

[Fig 21]
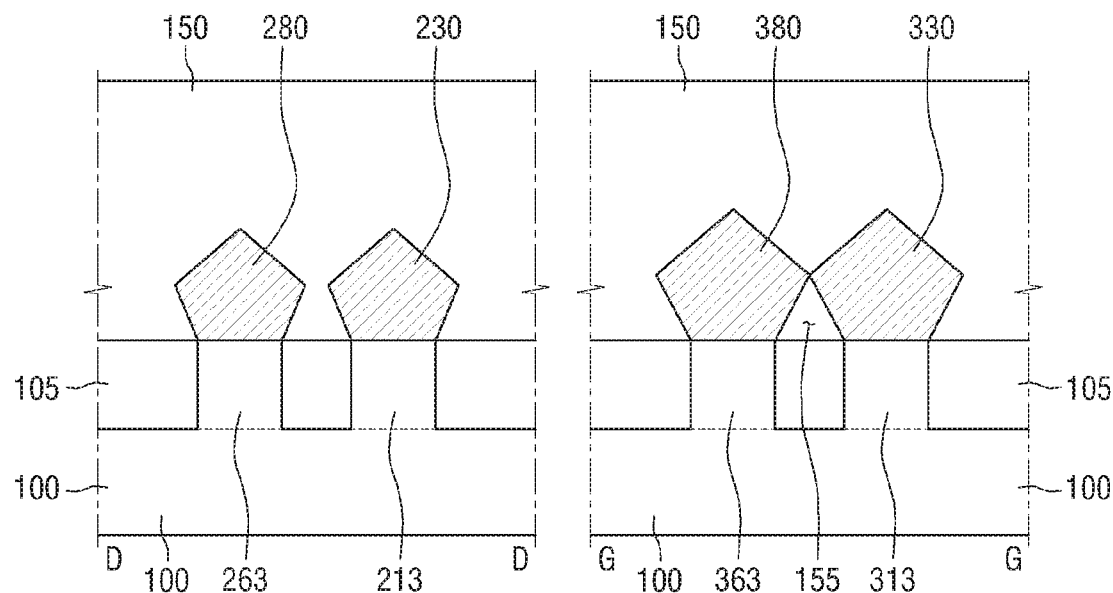
[Fig 22]
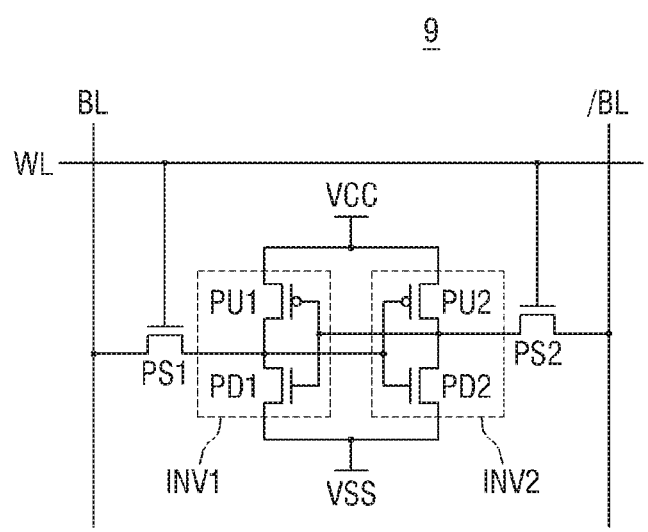

[Fig 23]
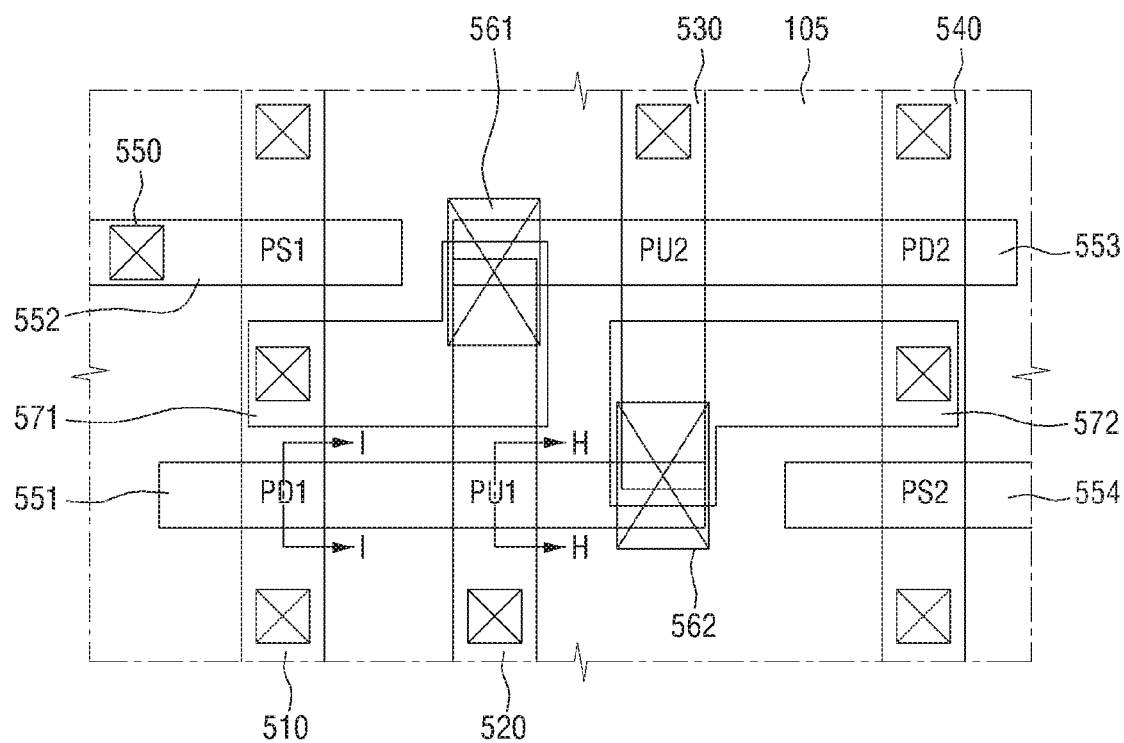

[Fig 24]
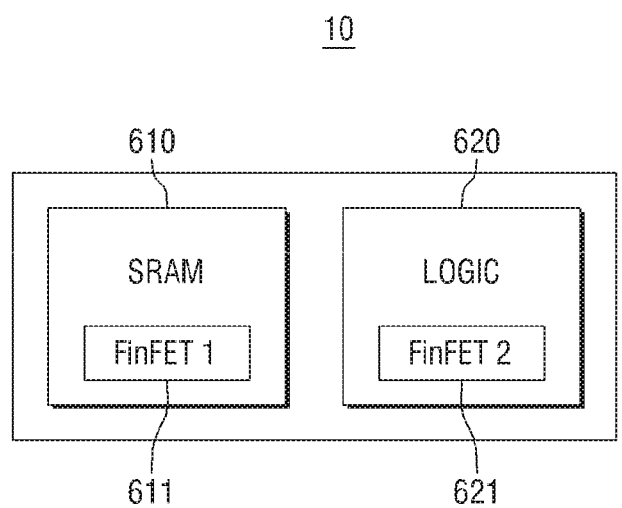
[Fig 25]
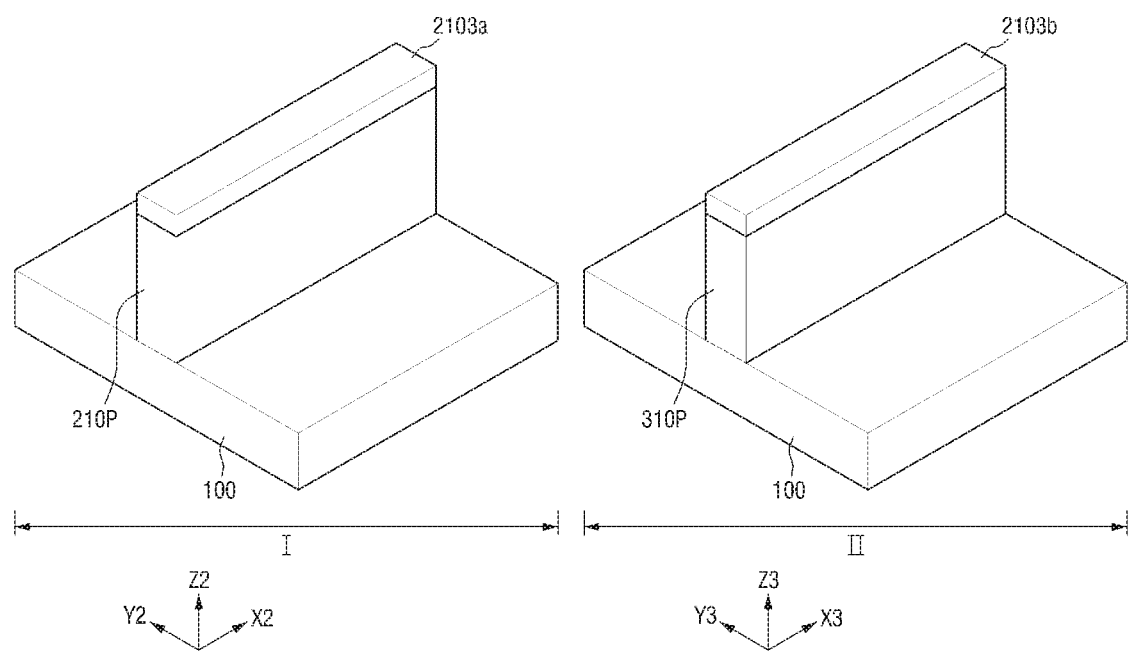

[Fig 26]
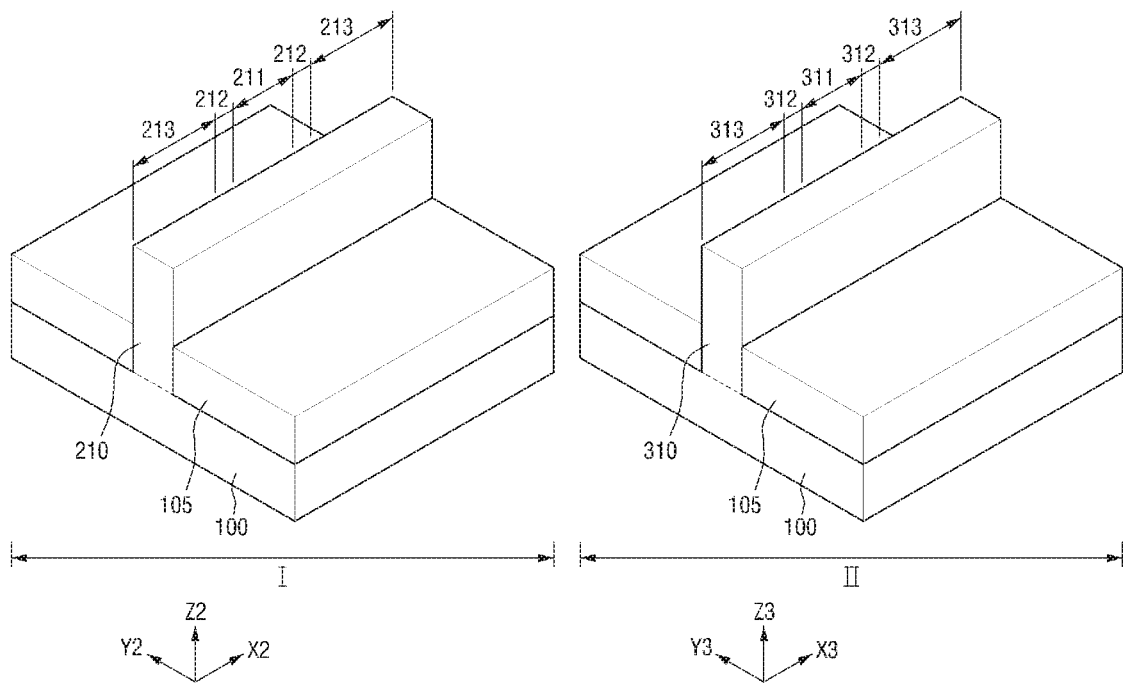
[Fig 27]
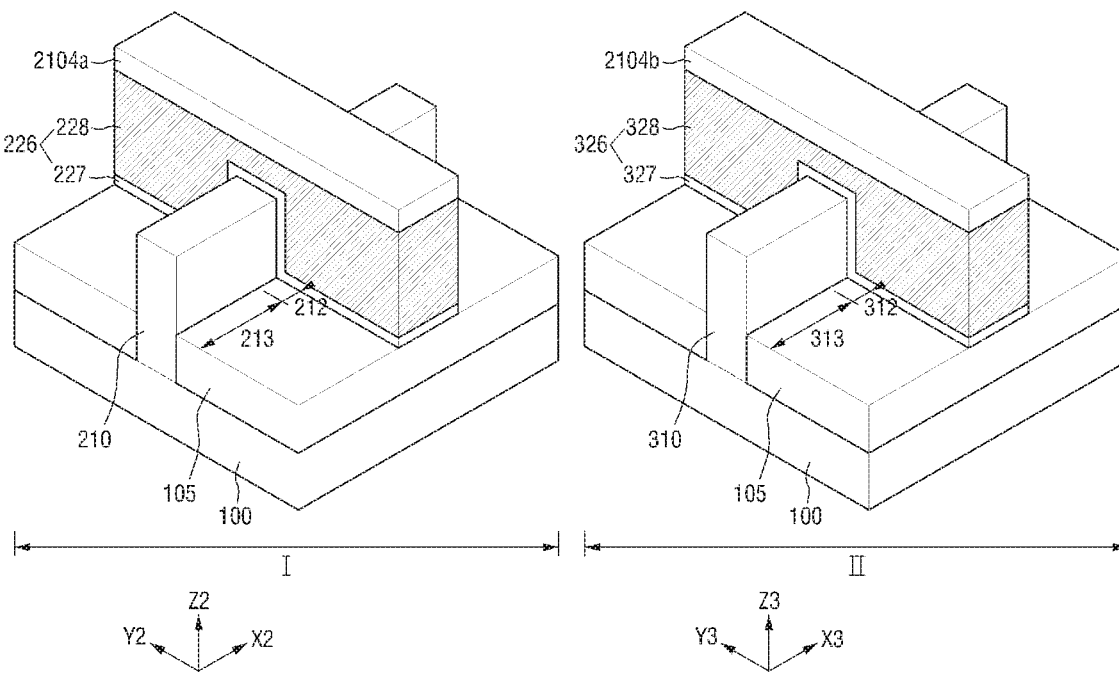

[Fig 28]
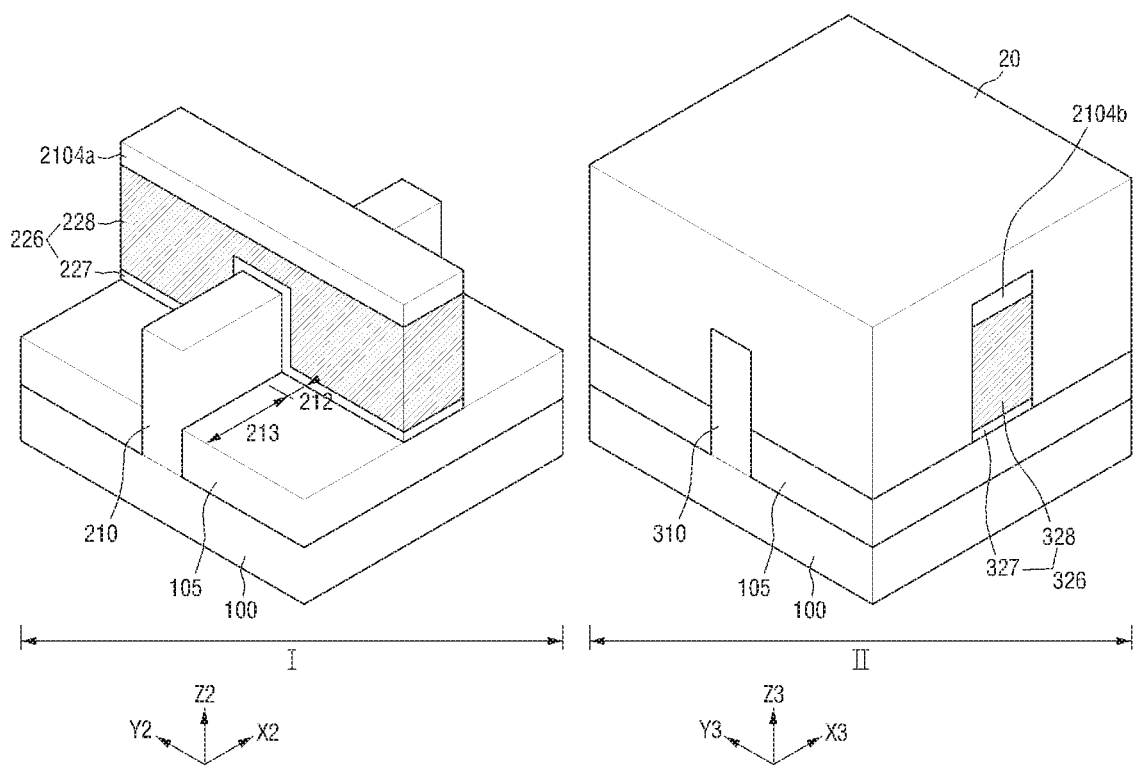

[Fig 29]
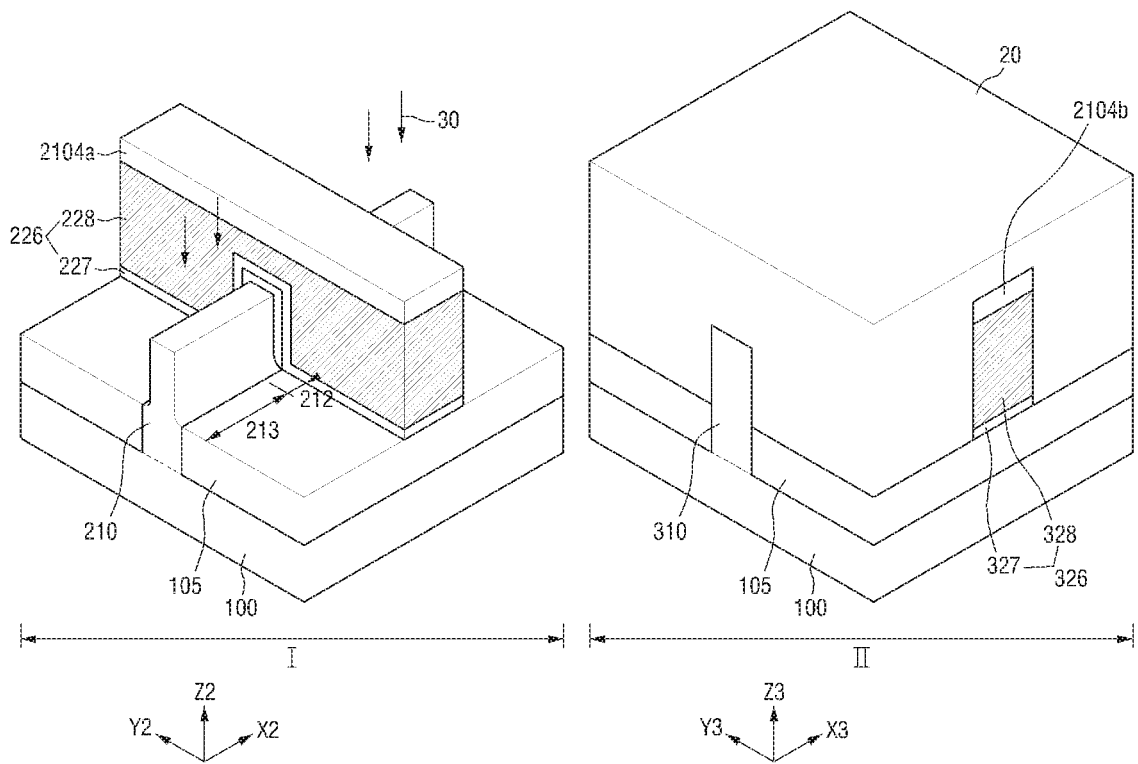
[Fig 30]
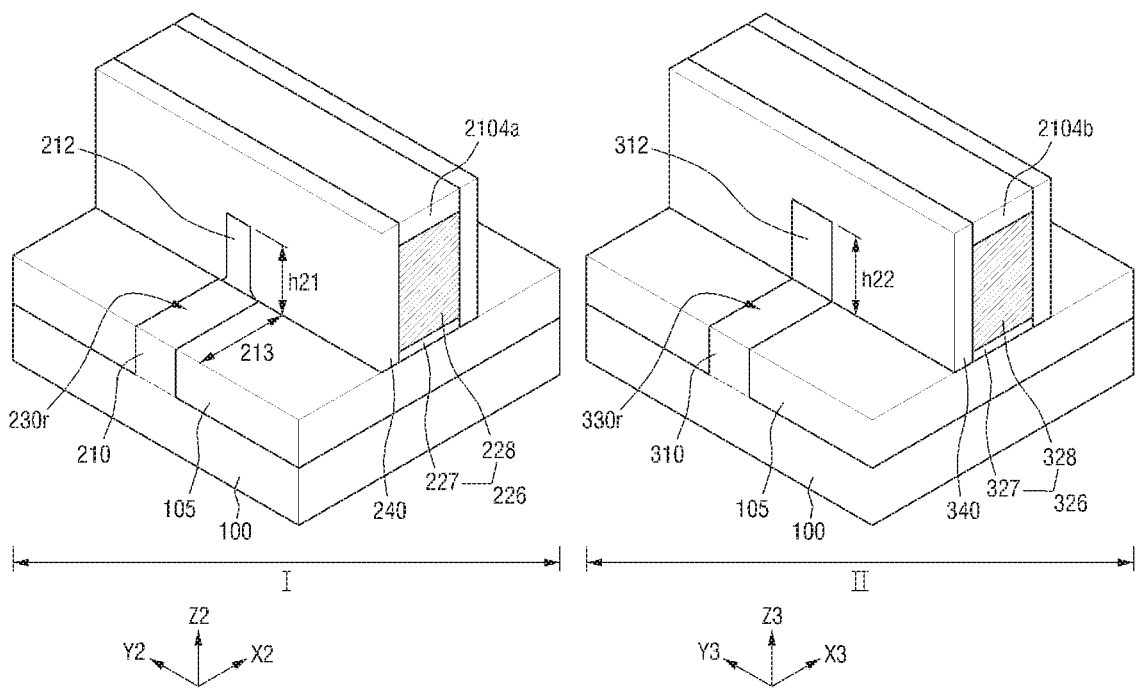

[Fig 31]
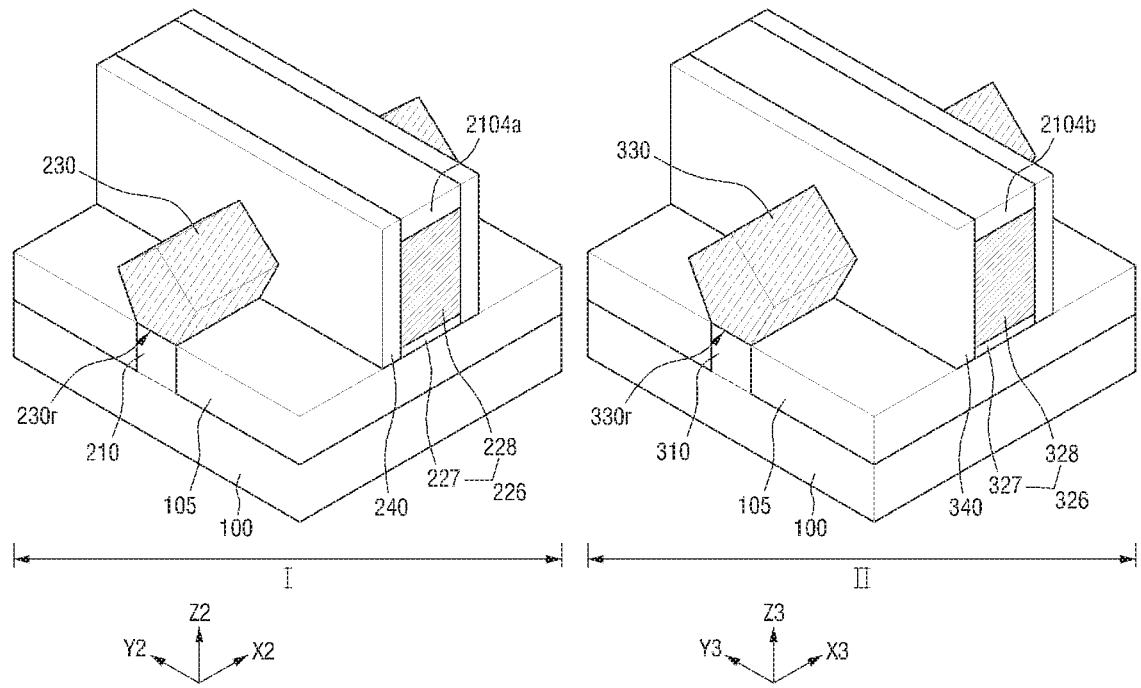
[Fig 32]
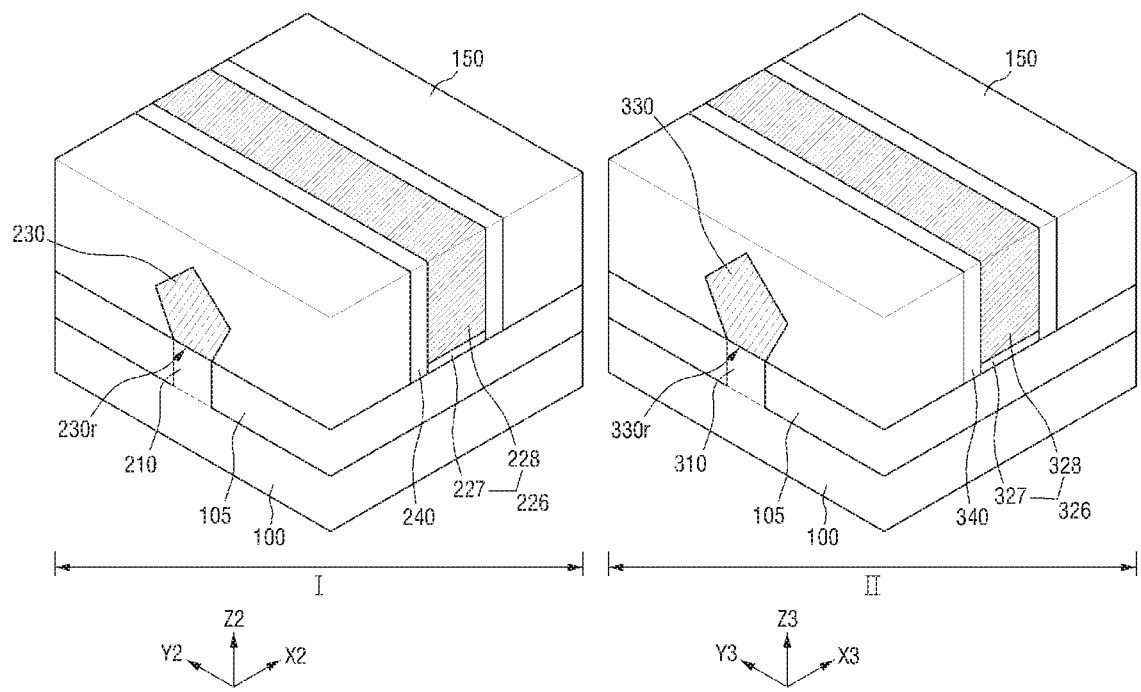

[Fig 33]
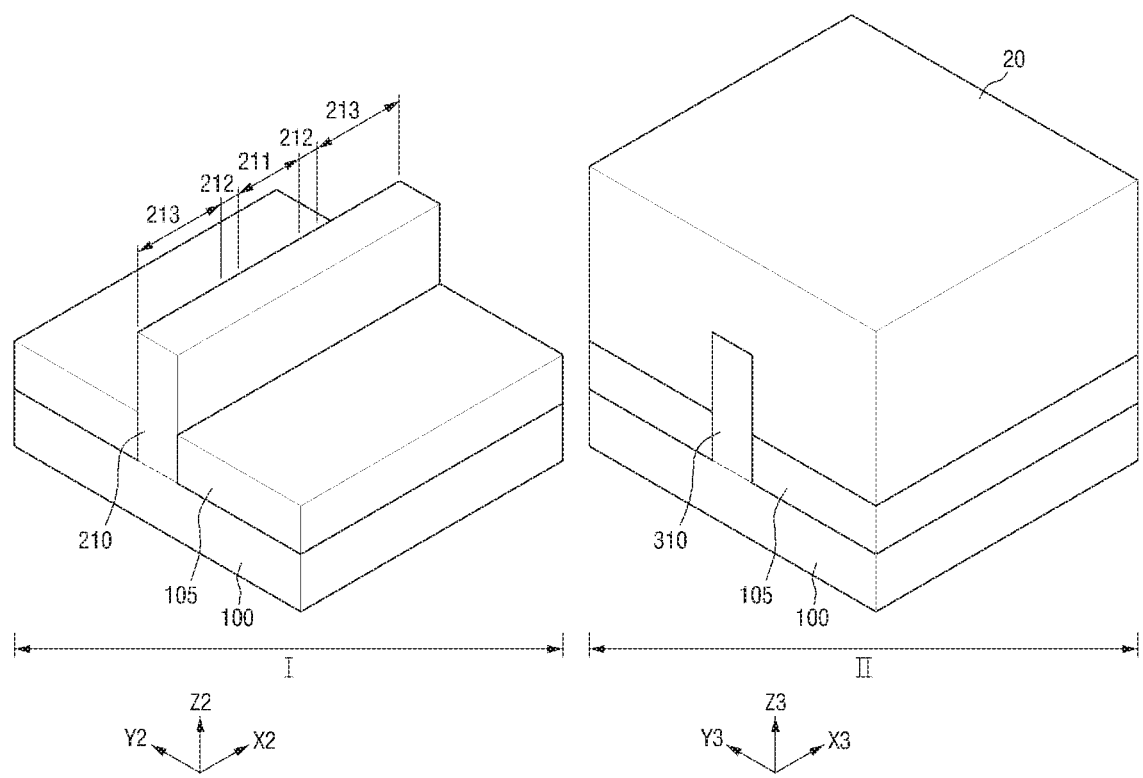

[Fig 34]
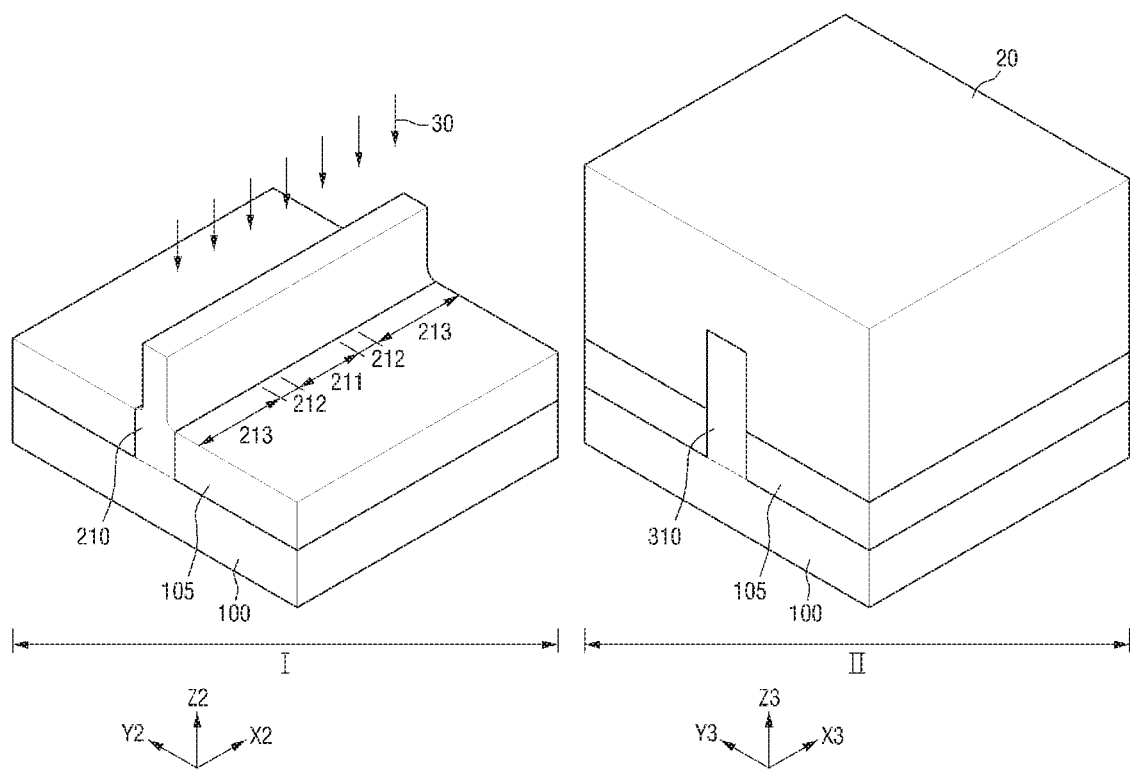

【Fig 35】
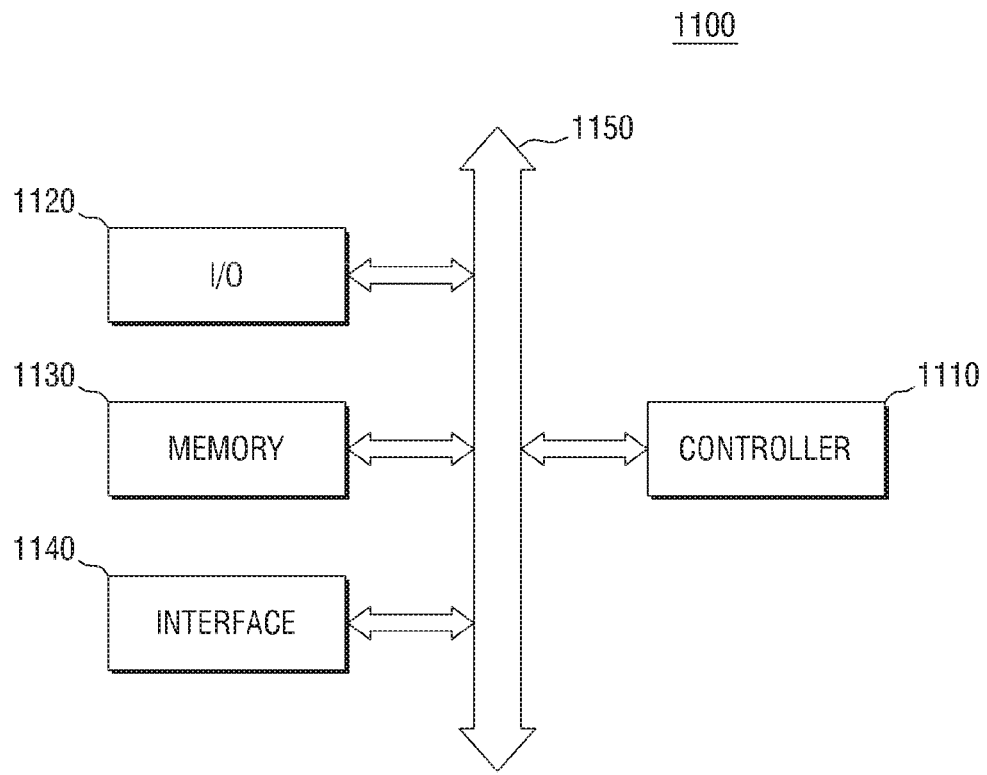
【Fig 36】
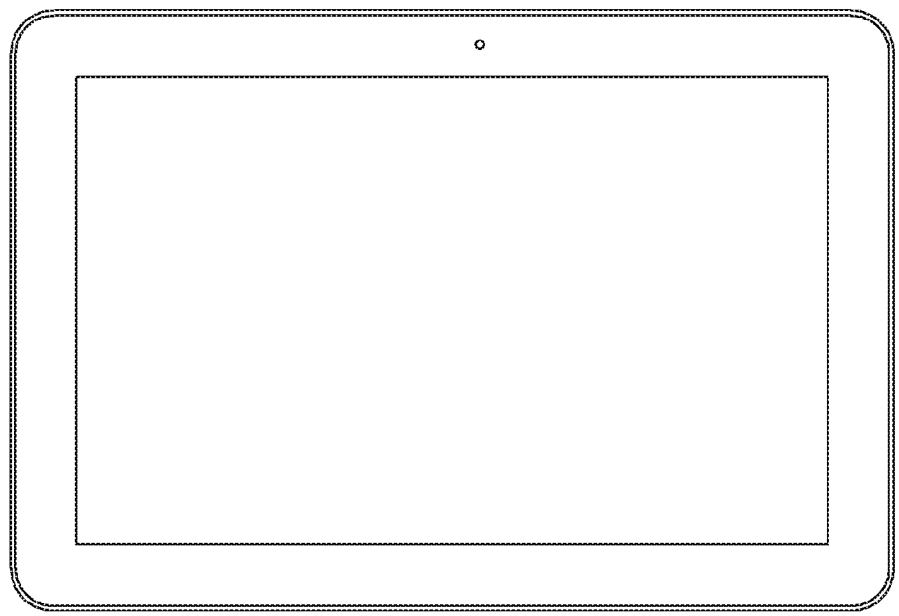

[ Fig 37]
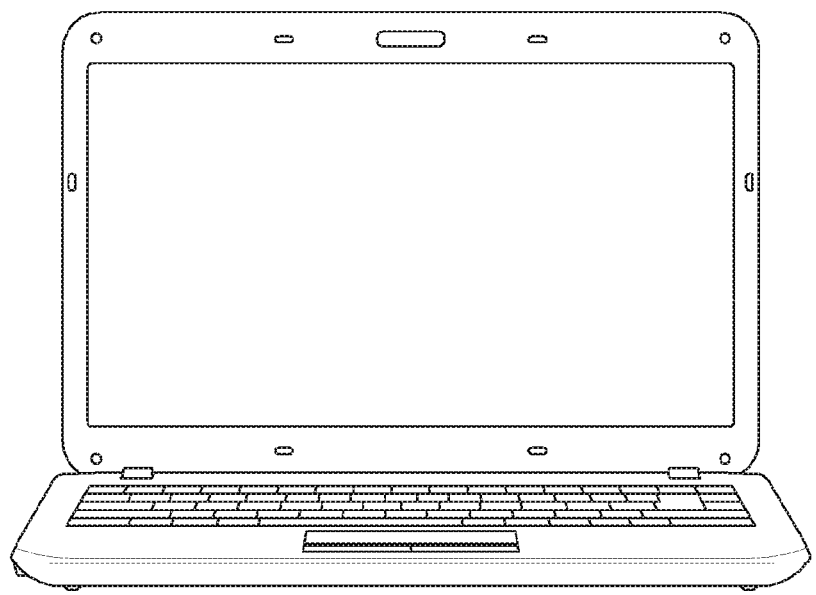

ND METHOD
SEMICONDUCTOR DEVICE AND METHOD FOR FABRICATING THE SAME

CROSS-REFERENCE TO RELATED APPLICATION

This U.S. Continuation patent application claims priority to U.S. patent application Ser. No. 15/344,834, filed Nov. 7, 2016, which is a continuation of U.S. patent application Ser. No. 14/750,303, filed on Jun. 25, 2015, now U.S. Pat. No. 9,490,258, issued Nov. 8, 2016, which claims priority to Korean Patent Application No. 10-2014-0117063 filed on Sep. 3, 2014 in the Korean Intellectual Property Office, and all the benefits accruing therefrom under 35 U.S.C. 119, the contents of which in its entirety are herein incorporated by reference.

BACKGROUND

1. Field

Inventive concepts relate to a semiconductor device and a method for fabricating the same.

2. Description of the Related Art

A scaling technique for increasing the density of a semiconductor device, a gate all around structure in which a silicon body shaped of a nanowire is formed on a substrate and a gate is formed to surround the silicon body, has been proposed.

SUMMARY

In exemplary embodiments a semiconductor device reduces a size of a source/drain by reducing a dimension of a fin serving as a seed of an epitaxial pattern formed as the source/drain.

In exemplary embodiments a method for fabricating a semiconductor device forms a semiconductor device that can reduce a size of a source/drain by reducing a dimension of a fin serving as a seed of an epitaxial pattern formed as the source/drain.

In accordance with principles of inventive concepts, there is provided a semiconductor device comprising a first fin type active pattern formed on a substrate, extending in a first direction and including first to third parts, the first to third parts being sequentially arranged in the first direction, a height ranging from a top surface of the substrate to a top surface of the first part being greater than a height ranging from the top surface of the substrate to a top surface of the second part, and a height ranging from the top surface of the substrate to the top surface of the second part being greater than a height ranging from the top surface of the substrate to a top surface of the third part, a gate electrode extending in a second direction different from the first direction and formed on the first part, and a first source/drain formed on the third part.

In accordance with principles of inventive concepts, the semiconductor device may further comprise a field insulation layer formed on the substrate and making contact with portions of sidewalls of the first fin type active pattern. Sidewalls of the third part entirely make contact with the field insulation layer.

In accordance with principles of inventive concepts, the first part, the second part and the third part have the same width at a boundary between the field insulation layer and the first fin type active pattern.

In accordance with principles of inventive concepts, the first part has a greater width than the second part at a first height from a top surface of the field insulation layer.

In accordance with principles of inventive concepts, the top surface of the second part and the top surface of the first part have discontinuous profiles, and opposite sidewalls of the second part facing each other in the second direction and opposite sidewalls of the first part facing each other in the second direction have discontinuous profiles.

In accordance with principles of inventive concepts, the first part includes connecting sidewalls, and the connecting sidewalls connect the top surface of the first part and the top surface of the second part and connect the opposite sidewalls of the first part and the opposite sidewalls of the second part.

In accordance with principles of inventive concepts, the semiconductor device may further comprise a gate spacer formed on the second part and extending in the second direction. The gate spacer overlaps with the connecting sidewalls.

In accordance with principles of inventive concepts, the semiconductor device may further comprise a field insulation layer formed on the substrate and making contact with portions of sidewalls of the first fin type active pattern. The top surface of the third part upwardly protrudes from the top surface of the field insulation layer In accordance with principles of inventive concepts, the semiconductor device may further comprise a fin spacer formed on the sidewalls of the third part upwardly protruding from the top surface of the field insulation layer.

In accordance with principles of inventive concepts, the semiconductor device may further comprise a second fin type active pattern formed on the substrate to extend in the first direction and including fourth to sixth parts, and a second source/drain formed on the sixth part. The fourth to sixth parts are sequentially arranged in the first direction, a height ranging from the top surface of the substrate to a top surface of the fourth part is greater than a height ranging from the top surface of the substrate to a top surface of the fifth part, and the height ranging from the top surface of the substrate to the top surface of the fifth part is greater than a height ranging from the top surface of the substrate to a top surface of the sixth part, and the gate electrode is formed on the fourth part, and the second source/drain makes contact with the first source/drain.

In accordance with principles of inventive concepts, there is provided a semiconductor device comprising a substrate including a first region and a second region, a first transistor formed on the first region, wherein the first transistor includes a first fin type active pattern formed on the substrate and extending in a first direction and including first to third parts sequentially arranged in the first direction, a first gate electrode extending in a second direction different from the first direction and formed on the first part, and a first source/drain formed on the third part, and a second transistor formed on the second region, wherein the second transistor includes a second fin type active pattern formed on the substrate and extending in a third direction and including fourth to sixth parts sequentially arranged in the third direction, a second gate electrode extending in a fourth direction different from the third direction and formed on the fourth part, and a second source/drain formed on the sixth part, wherein a height ranging from a top surface of the substrate to a top surface of the first part is greater than a height ranging from the top surface of the substrate to a top surface of the second part, a height ranging from the top surface of the substrate to the top surface of the second part is greater than a height ranging from the top surface of the substrate to a top surface of the third part, and a height ranging from the top surface of the substrate to a top surface of the fourth part and a height ranging from the top surface of the substrate to a top surface of the fifth part are greater than a height ranging from the top surface of the substrate to a top surface of the sixth part.

In accordance with principles of inventive concepts, the height ranging from the top surface of the substrate to the top surface of the fourth part is equal to the height ranging from the top surface of the substrate to the top surface of the fifth part.

In accordance with principles of inventive concepts, the first transistor further comprises a first gate spacer formed on the second part and the second transistor further comprises a second gate spacer formed on the fifth part.

In accordance with principles of inventive concepts, the semiconductor device may further comprise a field insulation layer formed on the substrate and making contact with portions of sidewalls of the first fin type active pattern. Sidewalls of the third part entirely making contact with the field insulation layer.

In accordance with principles of inventive concepts, the first region is an SRAM region and the second region is a logic region.

In accordance with principles of inventive concepts, the first region is a PMOS region in an SRAM and the second region is an NMOS region in the SRAM.

In accordance with principles of inventive concepts, the semiconductor device may further comprise a field insulation layer formed on the substrate and making contact with portions of sidewalls of the first fin type active pattern. The top surface of the third part upwardly protrudes from a top surface of the field insulation layer.

In accordance with principles of inventive concepts, the first transistor further comprises a fin spacer formed on the sidewalls of the third part upwardly protruding from the top surface of the field insulation layer.

In accordance with principles of inventive concepts, the first region is an SRAM region and the second region is a logic region.

In accordance with principles of inventive concepts, the first region is a PMOS region in an SRAM and the second region is an NMOS region in the SRAM.

In accordance with principles of inventive concepts, the height ranging from the top surface of the substrate to the top surface of the fourth part is greater than the height ranging from the top surface of the substrate to the top surface of the fifth part.

In accordance with principles of inventive concepts, the semiconductor device may further comprise a field insulation layer formed on the substrate and making contact with portions of sidewalls of the first fin type active pattern and portions of sidewalls of the second fin type active pattern. The top surface of the third part upwardly protrudes from a top surface of the field insulation layer.

In accordance with principles of inventive concepts, the first transistor further comprises a fin spacer formed on the sidewalls of the third part upwardly protruding from the top surface of the field insulation layer, and sidewalls of the sixth part entirely make contact with the field insulation layer.

In accordance with principles of inventive concepts, the first region and the second region are included in the SRAM.

In accordance with principles of inventive concepts, a width of the second source/drain extending in the fourth direction is greater width than a width of the first source/drain extending in the second direction.

According to still another aspect of the present inventive concept, there is provided a semiconductor device comprising a substrate including a first region and a second region, a first transistor formed on a substrate, and a second transistor formed on the second region, wherein the first transistor includes a first fin type active pattern formed on the substrate and extending in a first direction and including first and second part, a first gate electrode extending in a second direction different from the first direction and formed on the first part, and a first source/drain formed on the second part, wherein the second transistor includes a second fin type active pattern formed on the substrate and extending in a third direction and including third and fourth parts, a second gate electrode extending in a fourth direction different from the third direction and formed on the third part, and a second source/drain formed on the fourth part, wherein the second part is disposed at opposite sides of the first part in the first direction, and the fourth part is disposed at opposite sides of the third part in the third direction, and wherein a width of the second source/drain extending in the fourth direction is greater width than a width of the first source/drain extending in the second direction.

In accordance with principles of inventive concepts, a height ranging from a top surface of the substrate to a top surface of the first part is greater than a height ranging from the top surface of the substrate to a top surface of the second part, and a height ranging from the top surface of the substrate to a top surface of the third part is greater than a height ranging from the top surface of the substrate to a top surface of the fourth part.

In accordance with principles of inventive concepts, the first fin type active pattern includes a fifth part positioned between the first part and the second part, and a height ranging from the top surface of the substrate to a top surface of the fifth part is smaller than the height ranging from the top surface of the substrate to the top surface of the first part and greater than the height ranging from the top surface of the substrate to the top surface of the second part.

In accordance with principles of inventive concepts, the height ranging from the top surface of the substrate to the top surface of the third part is greater than the height ranging from the top surface of the substrate to the top surface of the first part.

In accordance with principles of inventive concepts, a height of the second source/drain is greater than a height of the first source/drain.

In accordance with principles of inventive concepts, the first region is an SRAM region and the second region is a logic region.

In accordance with principles of inventive concepts, the first region is a PMOS region in an SRAM and the second region is an NMOS region in the SRAM.

According to a further aspect of the present inventive concept, there is provided a semiconductor device comprising a substrate including a first region and a second region, a first transistor formed on the first region, and a second transistor formed on the second region, wherein the first transistor includes a first fin type active pattern formed on and extending in a first direction and including first and second parts, a first gate electrode extending in a second direction different from the first direction and formed on the first part, and a first source/drain formed on the second part, wherein the second transistor includes a second fin type active pattern formed on the substrate and extending in a third direction and including third and fourth parts, a second gate electrode extending in a fourth direction different from the third direction and formed on the third part, and a second source/drain formed on the fourth part, wherein the second part is disposed at opposite sides of the first part in the first direction, and the fourth part is disposed at opposite sides of the third part in the third direction, and wherein a height ranging from a top surface of the substrate to a top surface of the first part is greater than a height ranging from the top surface of the substrate to a top surface of the second part, a height ranging from the top surface of the substrate to a top surface of the third part is greater than a height ranging from the top surface of the substrate to a top surface of the fourth part, and the height ranging from the top surface of the substrate to the top surface of the third part is greater than the height ranging from the top surface of the substrate to the top surface of the first part.

In accordance with principles of inventive concepts, a width of the second source/drain extending in the fourth direction is greater than a width of the first source/drain extending in the second direction.

In accordance with principles of inventive concepts, a height of the second source/drain is greater than a height of the first source/drain.

In accordance with principles of inventive concepts, the first region is an SRAM region and the second region is a logic region.

In accordance with principles of inventive concepts, the first region is a PMOS region in an SRAM and the second region is an NMOS region in the SRAM.

According to yet another aspect of the present inventive concept, there is provided a method for fabricating a semiconductor device, the method comprising forming a fin type active pattern defined by a field insulation layer, extending in a first direction, including first to third parts sequentially arranged in the first direction and upwardly protruding from a top surface of the field insulation layer, forming a dummy gate electrode extending in a second direction different from the first direction and crossing the fin type active pattern on the first part, trimming the second and third parts upwardly protruding from the top surface of the field insulation layer using the dummy gate electrode as a mask, forming a gate spacer formed on the second part and sidewalls of the dummy gate electrode after the trimming the second and third parts, forming a recess in the third part using the dummy gate electrode as a mask, and forming a source/drain filling the recess on the third part.

In accordance with principles of inventive concepts, the trimming reduces heights and widths of the second part and the third part.

According to still another aspect of the present inventive concept, there is provided a method for fabricating a semiconductor device, the method comprising forming a fin type active pattern defined by a field insulation layer, extending in a first direction, including first to third parts sequentially arranged in the first direction and upwardly protruding from a top surface of the field insulation layer, trimming the fin type active pattern upwardly protruding from the top surface of the field insulation layer, forming a dummy gate electrode extending in a second direction different from the first direction and crossing the fin type active pattern on the trimmed first part, forming a gate spacer formed on sidewalls of the dummy gate electrode and the trimmed second part, forming a recess in the third part using the dummy gate electrode as a mask, and forming a source/drain filling the recess on the third part.

In accordance with principles of inventive concepts, the trimming reduces heights and widths of the second part and the third part.

In exemplary embodiments the source/drain is epitaxially grown, using the fin type active region as a seed.

In exemplary embodiments a semiconductor device includes a first field effect transistor including a fin type active pattern extending end-to-end in a first direction and including a reduced-dimension epitaxial seed segment at each end; an epitaxial source/drain grown from the reduced-dimension epitaxial seed segment at each end of the fin type active pattern; and a gate electrode extending in a second direction different from the first and formed between the source/drains.

In exemplary embodiments a semiconductor device includes a second field effect transistor including; a fin type active pattern extending end-to-end in a third direction and including a unreduced epitaxial seed segment at each end; an epitaxial source/drain grown from the reduced-dimension epitaxial seed segment at each end of the fin type active pattern; and a gate electrode extending in a fourth direction different from the first and formed between the source/drains.

In exemplary embodiments a semiconductor device includes a first field effect transistor for lower power operation.

In exemplary embodiments a semiconductor device includes a first field effect transistor for operation in a memory circuit.

In exemplary embodiments a second field effect transistor for operation in peripheral circuitry.

BRIEF DESCRIPTION OF THE DRAWINGS

The above and other features and advantages of the present inventive concept will become more apparent by describing in detail exemplary embodiments thereof with reference to the attached drawings in which:

FIG. 1 is a perspective view for explaining a semiconductor device according to a first exemplary embodiment in accordance with principles of inventive concepts;

FIG. 2 is a view illustrating only a fin type active pattern and a field insulation layer in FIG. 1;

FIGS. 3 and 4 are cross-sectional views of the semiconductor device shown in FIG. 1, taken along lines A-A, B-B, C-C and D-D of FIG. 1;

FIGS. 5 and 6 are views for explaining a semiconductor device according to a second exemplary embodiment in accordance with principles of inventive concepts;

FIGS. 7 to 9 are views for explaining a semiconductor device according to a third exemplary embodiment in accordance with principles of inventive concepts;

FIG. 10 is a perspective view for explaining a semiconductor device according to a fourth exemplary embodiment in accordance with principles of inventive concepts;

FIG. 11 illustrates cross-sectional views taken along lines A-A and E-E of FIG. 10;

FIG. 12 illustrates cross-sectional views taken along lines C-C and F-F of FIG. 10;

FIG. 13 illustrates cross-sectional views taken along lines D-D and G-G of FIG. 10;

FIG. 14 is a cross-sectional view for explaining a semiconductor device according to a fifth exemplary embodiment in accordance with principles of inventive concepts;

FIGS. 15 to 17 are views for explaining a semiconductor device according to a sixth exemplary embodiment in accordance with principles of inventive concepts;

FIG. 18 is a cross-sectional view for explaining a semiconductor device according to a seventh exemplary embodiment in accordance with principles of inventive concepts;

FIGS. 19 and 21 are views for explaining a semiconductor device according to an eighth exemplary embodiment in accordance with principles of inventive concepts;

FIGS. 22 and 23 are a circuit view and a layout view for explaining a semiconductor device according to a ninth exemplary embodiment in accordance with principles of inventive concepts;

FIG. 24 is a conceptual diagram for explaining a semiconductor device according to a tenth exemplary embodiment in accordance with principles of inventive concepts;

FIGS. 25 to 32 illustrate intermediate process steps in a method for fabricating a semiconductor device according to an exemplary embodiment in accordance with principles of inventive concepts;

FIGS. 33 and 34 illustrate intermediate process steps in a method for fabricating a semiconductor device according to another exemplary embodiment in accordance with principles of inventive concepts;

FIG. 35 is a block diagram of an electronic system including semiconductor devices fabricated by semiconductor device fabricating methods according to embodiments of the present inventive concept; and FIGS. 36 and 37 illustrate exemplary semiconductor systems to which semiconductor devices according to some embodiments of the present inventive concept can be employed.

DETAILED DESCRIPTION OF THE EMBODIMENTS

Inventive concepts will now be described more fully hereinafter with reference to the accompanying drawings, in which exemplary embodiments in accordance with principles of inventive concepts are shown. Inventive concepts may, however, be embodied in different forms and should not be construed as limited to the embodiments set forth herein. Rather, these embodiments are provided so that this disclosure will be thorough and complete, and will fully convey the scope in accordance with principles of inventive concepts to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which inventive concepts belong. It is noted that the use of any and all examples, or exemplary terms provided herein is intended merely to better illuminate the inventive concepts and is not a limitation on the scope of inventive concepts unless otherwise specified. Further, unless defined otherwise, all terms defined in generally used dictionaries may not be overly interpreted.

Hereinafter, a semiconductor device according to a first exemplary embodiment in accordance with principles of inventive concepts will be described with reference to FIGS. 1 to 4.

FIG. 1 is a perspective view for explaining a semiconductor device according to a first exemplary embodiment in accordance with principles of inventive concepts, FIG. 2 is a view illustrating only a fin type active pattern and a field insulation layer in FIG. 1, and FIGS. 3 and 4 are cross-sectional views of the semiconductor device shown in FIG. 1, taken along lines A-A, B-B, C-C and D-D of FIG. 1. For the sake of convenient explanation, an interlayer insulation layer 150 is not illustrated in FIG. 1.

Referring to FIGS. 1 to 4, the semiconductor device 1 according to a first exemplary embodiment in accordance with principles of inventive concepts may include a substrate 100, a field insulation layer 105, a first fin type active pattern 110, a first gate electrode 120, a first gate spacer 140, and a first source/drain 130.

The substrate 100 may be, for example, bulk silicon or a silicon-on-insulator (SOI). Alternatively, the substrate 100 may be a silicon substrate, or a substrate made of other materials selected from a group consisting of, for example, germanium, silicon germanium, indium antimonide, lead telluride compound, indium arsenide, indium phosphide, gallium arsenide, and gallium antimonide. The substrate 100 may be an epitaxial layer formed on a base substrate, for example.

The first fin type active pattern 110 may protrude from the substrate 100 and may be formed on the substrate 100. The field insulation layer 105 covers portions of sidewalls of the first fin type active pattern 110 and the first fin type active pattern 110 upwardly protrudes from the field insulation layer 105 formed on the substrate 100. The field insulation layer 105 makes contact with the portions of the sidewalls of the first fin type active pattern 110. The first fin type active pattern 110 may be defined by the field insulation layer 105.

The first fin type active pattern 110 may extend in a first direction X1. The first fin type active pattern 110 includes a first part 111, a second part 112 and a third part 113. The first part 111, the second part 112 and the third part 113 of the first fin type active pattern 110 may be sequentially arranged in the first direction X1, extending sequentially in both positive X1 and negative X1 directions from a center in first part 111.

In other words, the second part 112 of the first fin type active pattern 110 is disposed at opposite sides of the first part 111 of the first fin type active pattern 110 in the first direction X1 and the third part 113 of the first fin type active pattern 110 is disposed at opposite sides of the first part 111 of the first fin type active pattern 110 in the first direction X1, outside second part 112.

As shown in FIG. 2, a top surface 111u of the first part 111 of the first fin type active pattern 110 and a top surface 112u of the second part 112 of the first fin type active pattern 110 upwardly protrude from a top surface 105u of the field insulation layer 105. A top surface 113u of the third part 113 of the first fin type active pattern 110 may not upwardly protrude from the top surface 105u of the field insulation layer 105, but aspects of the inventive concepts are not limited thereto.

The first part 111 and second part 112 of the first fin type active pattern 110 may upwardly protrude from the field insulation layer 105 and the third part 113 of the first fin type active pattern 110 may not upwardly protrude from the field insulation layer 105. Sidewalls 113s of the third part 113 of the first fin type active pattern 110 may entirely make contact with the field insulation layer 105, with the field insulation layer 105 extending at least to the top of active pattern 110.

The height ranging from the top surface of the substrate 100 to the top surface 111u of the first part 111 of the first fin type active pattern 110 is denoted by a first height h1, the height ranging from the top surface of the substrate 100 to the top surface 112u of the second part 112 of the first fin type active pattern 110 is denoted by a second height h2, and the height ranging from the top surface of the substrate 100 to the top surface 113u of the third part 113 of the first fin type active pattern 110 is denoted by a third height h3.

In exemplary embodiments in accordance with principles of inventive concepts second part 112 of the first fin type active pattern 110 is recessed relative to the first part 111 of the first fin type active pattern 110 and the third part 113 of the first fin type active pattern 110 is recessed relative to the second part 112 of the first fin type active pattern 110.

In other words, height h1 ranging from the top surface of the substrate 100 to the top surface 111u of the first part 111 of the first fin type active pattern 110 is greater than height h2 ranging from the top surface of the substrate 100 to the top surface 112u of the second part 112 of the first fin type active pattern 110. Additionally, height h2 ranging from the top surface of the substrate 100 to the top surface 112u of the second part 112 of the first fin type active pattern 110 is greater than height h3 ranging from the top surface of the substrate 100 to the top surface 113u of the third part 113 of the first fin type active pattern 110.

Because height h1 ranging from the top surface of the substrate 100 to the top surface 111u of the first part 111 of the first fin type active pattern 110 is greater than height h2 ranging from the top surface of the substrate 100 to the top surface 112u of the second part 112 of the first fin type active pattern 110, the top surface 111u of the first part 111 of the first fin type active pattern 110 and the top surface 112u of the second part 112 of the first fin type active pattern 110 may not have a continuous profile. That is, there may be a step difference between the top surface 111u of the first part 111 of the first fin type active pattern 110 and the second part 112 of the first fin type active pattern 110.

The first part 111 of the first fin type active pattern 110 may include sidewalls 111s facing each other in a second direction Y1 and connecting sidewalls 111c facing each other in the first direction X1. The second part 112 of the first fin type active pattern 110 may include sidewalls 112s facing each other in the second direction Y1 and connecting sidewalls 112c facing each other in the first direction X1.

As shown in FIG. 2, the sidewalls 111s of the first part 111 of the first fin type active pattern 110, facing each other in the second direction Y1, and the sidewalls 112s of the second part 112 of the first fin type active pattern 110, facing each other in the second direction Y1, may not have a continuous profile, but aspects of inventive concepts are not limited thereto.

That is, the sidewalls 111s of the first part 111 of the first fin type active pattern 110, facing each other in the second direction Y1, and the sidewalls 112s of the second part 112 of the first fin type active pattern 110, facing each other in the second direction Y1, may have a continuous profile, and only the second part 112 of the first fin type active pattern 110 may be recessed relative to the first part 111 of the first fin type active pattern 110, for example. However, for convenience of explanation, semiconductor devices according to embodiments of the present inventive concept will be described based on the assumption that the top surface 111u and sidewalls 111s of the first part 111 of the first fin type active pattern 110 discontinuously meet the top surface 112u and the sidewalls 112s of the second part 112 of the first fin type active pattern 110.

The connecting sidewalls 111c of the first part 111 of the first fin type active pattern 110 connect the top surface 111u of the first part 111 of the first fin type active pattern 110 with the top surface 112u of the second part 112 of the first fin type active pattern 110. Similarly, the connecting sidewalls 111c of the first part 111 of the first fin type active pattern 110 connect the sidewalls 111s of the first part 111 of the first fin type active pattern 110 and the sidewalls 112s of the second part 112 of the first fin type active pattern 110.

A first width w1 of the first part 111 of the first fin type active pattern 110, a second width w2 of the second part 112 of the first fin type active pattern 110 and a third width w3 of the third part 113 of the first fin type active pattern 110 are equal at a boundary where the first fin type active pattern 110 and the top surface 105u of the field insulation layer 105 meet each other.

However, a width w11 of the first part 111 of the first fin type active pattern 110 and a width w21 of the second part 112 of the first fin type active pattern 110 may be different from each other at a location on the field insulation layer 105, spaced a first distance L apart from the top surface 105u of the field insulation layer 105. For example, the width w11 of the first part 111 of the first fin type active pattern 110 may be greater than the width w21 of the second part 112 of the first fin type active pattern 110.

For convenience of explanation, the top surface 105u of the field insulation layer 105 is illustrates as being planar, but aspects of inventive concepts are not limited thereto. In semiconductor devices according to embodiments of the present inventive concept, a first distance L from the top surface 105u of the field insulation layer 105 onto the field insulation layer 105 is measured on the basis of a contact point of the first fin type active pattern 110 and the top surface 105u of the field insulation layer 105.

At a boundary between the second part 112 of the first fin type active pattern 110 and the top surface 105u of the field insulation layer 105, a portion of the first fin type active pattern 110 being in contact with the field insulation layer 105 and a portion of the first fin type active pattern 110, upwardly protruding from the field insulation layer 105, may be equal in width, that is, a second width w2, but aspects of inventive concepts are not limited thereto.

In exemplary embodiments in accordance with principles of inventive concepts first fin type active pattern 110 may be a portion of the substrate 100 and may include an epitaxial layer grown from the substrate 100. The first fin type active pattern 110 may include, for example, silicon or germanium, which is an element semiconductor material. Additionally, the first fin type active pattern 110 may include a compound semiconductor, including, for example, a Group IV-IV compound semiconductor or a Group III-V compound semiconductor. Examples of such Group IV-IV compound semiconductors may include a binary compound or a ternary compound including at least two elements selected from the group consisting of carbon (C), silicon (Si), germanium (Ge), and tin (Sn), and compounds doped with Group IV elements. The III-V group compound semiconductor may include, for example, a binary compound, a ternary compound or a quaternary compound, prepared by combining at least one group III element of aluminum (Al), gallium (Ga) and indium (In) with at least one group V element of phosphorus (P), arsenic (As) and antimony (Sb).

In exemplary embodiments in accordance with principles of inventive concepts, it is assumed that the first fin type active pattern 110 includes silicon.

The first gate electrode 120 may extend in the second direction Y1 and may cross the first fin type active pattern 110. The first gate electrode 120 may be formed on the first fin type active pattern 110 and the field insulation layer 105, with the first gate electrode 120 is formed on the first part 111 of the first fin type active pattern 110.

The first gate electrode 120 may include metal layers MG1 and MG2. As shown, the first gate electrode 120 may include two or more metal layers MG1 and MG2 stacked one on another. In exemplary embodiments, the first metal layer MG1 may function to adjust a work function, and the second metal layer MG2 may function to fill a space formed by the first metal layer MG1. For example, the first metal layer MG1 may include at least one of TiN, TaN, TiC, and TaC and the second metal layer MG2 may include W or Al. Alternatively, the first gate electrode 120 may be made of a non-metal material, such as Si, or SiGe.

The first gate electrode 120 may be formed by, for example, a replacement process, but aspects of inventive concepts are not limited thereto.

The first gate spacer 140 may be formed on sidewalls of the first gate electrode 120 extending in the second direction Y1.

The first gate spacer 140 may be formed on the second part 112 of the first fin type active pattern 110, for example, with the first gate spacer 140 formed on the top surface 112u and the sidewalls 112s of the second part 112 of the first fin type active pattern 110 upwardly protruding from the field insulation layer 105.

Because height h1 ranging from the top surface of the substrate 100 to the top surface 111u of the first part 111 of the first fin type active pattern 110 is greater than height h2 ranging from the top surface of the substrate 100 to the top surface 112u of the second part 112 of the first fin type active pattern 110, a portion of the first gate spacer 140 may overlap with the connecting sidewalls 111c of the first part 111 of the first fin type active pattern 110. For example, the portion of the first gate spacer 140 may make contact with the connecting sidewalls 111c of the first part 111 of the first fin type active pattern 110.

The first gate spacer 140 may include, for example, at least one of silicon nitride (SiN), silicon oxynitride (SiON), silicon oxide (SiO$_2$), silicon oxycarbonitride (SiOCN) and combinations thereof. In the illustrated embodiment, the first gate spacer 14 is a single layer, but aspects of inventive concepts are not limited thereto. The first gate spacer 14 may have a multi-layered structure.

A first gate insulation layer 125 may be formed between the first fin type active pattern 110 and the first gate electrode 120. Additionally, the first gate insulation layer 125 may be formed between the first gate spacer 140 and the first gate electrode 120.

The first gate insulation layer 125 may be formed on the top surface 111u and the sidewalls 111s of the first part 111 of the first fin type active pattern 110. The first gate insulation layer 125 may be disposed between the first gate electrode 120 and the field insulation layer 105 and may be formed along the sidewalls of the first gate spacer 140.

In exemplary embodiments first gate insulation layer 125 is formed on the first part 111 of the first fin type active pattern 110 and the first gate spacer 140 is formed on the second part 112 of the first fin type active pattern 110. Accordingly, the height of the first gate insulation layer 125 formed along the sidewalls of the first gate spacer 140 on the top surface 111u of the first part 111 of the first fin type active pattern 110 may be less than the height of the first gate spacer 140 on the top surface 112u of the second part 112 of the first fin type active pattern 110.

The first gate insulation layer 125 may include a high-k material having a higher dielectric constant than a silicon oxide layer, for example. The first gate insulation layer 125 may include, for example, one or more selected from a group including hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but aspects of inventive concepts are not limited thereto.

The first source/drain 130 is formed at opposite sides of the first gate electrode 120 and the first gate spacer 140 on the first fin type active pattern 110 and is formed on the third part 113 of the first fin type active pattern 110.

That is, in exemplary embodiments, the first source/drain 130 is formed on the top surface 113u of the third part 113 of the first fin type active pattern 110 and the connecting sidewalls 112c of the second part 112 of the first fin type active pattern 110.

An outer circumferential surface of the first source/drain 130 may have various shapes. For example, the outer circumferential surface of the first source/drain 130 may have the shape of a diamond, a circle or a rectangle. In FIGS. 1 and 4, the first source/drain 130 having a diamond shape (or a pentagonal or hexagonal shape) is illustrated by way of example, but aspects of inventive concepts are not limited thereto.

In exemplary embodiments in which semiconductor device 1 is a PMOS transistor, the first source/drain 130 may include a compressive stress material. The compressive stress material may include, for example, a material having a greater lattice constant than Si, such as SiGe. The compressive stress material may improve the mobility of carriers of a channel region by applying compressive stress to the first fin type active pattern 110 (e.g., the first part 111 of the first fin type active pattern 110), for example.

In exemplary embodiments in which the semiconductor device 1 is an NMOS transistor, the first source/drain 130 may include the same material with the first fin type active pattern 110 or a tensile stress material. For example, when the first fin type active pattern 110 includes Si, the first source/drain 130 may include Si or a material having a smaller lattice constant than Si (e.g., SiC or carbon-containing silicon (Si:C)).

Additionally, although not shown in FIGS. 1 to 4, a seed layer may further be formed between the first source/drain 130 and the first fin type active pattern 110. In exemplary embodiments, the seed layer may be included in the first source/drain 130.

In addition, although not shown in FIGS. 1, 3 and 4, in exemplary embodiments the first source/drain 130 may further include a metal silicide layer formed on the first source/drain 130.

In exemplary embodiments in accordance with principles of inventive concepts semiconductor devices include reduced-dimension fin type field effect transistors (FinFets). Reduced-dimension FinFets in accordance with principles of inventive concepts permit greater circuit compaction and higher levels of integration. In the exemplary embodiment of FIGS. 1-4, for example, the height h2 of fin type active pattern segment 112 at either end of fin type active pattern 110, is reduced, compared to the height h1 of fin type active pattern segment 111. Additionally, the width W21 of fin type active pattern segment 112 is reduced, compared to the width W11 of fin type active pattern segment 111.

In exemplary embodiments a semiconductor device may include one or more functional blocks that employ reduced-dimension FinFets and one or more other functional blocks may employ un-reduced dimension FinFets. Those blocks employing reduced-dimension FinFets may require less powerful Fets, for example, and so may successfully employ those with reduced dimensions. In exemplary embodiments a semiconductor memory device include memory cell and peripheral circuit areas and may employ reduced-dimension FinFets in the memory cell area and un-reduced dimension FinFets in the peripheral circuit area, for example.

A reduced-dimension FinFet in accordance with principles of inventive concepts may include a fin type active pattern extending along one direction and a gate electrode extending in another direction to cover the device channel region. At either side of the gate electrode are regions of the Fin that have been reduced in at least one dimension, height or width, from the full-cross-section, or un-reduced, dimension of the Fin type active pattern. These reduced-dimensions may be produced, for example, by etching respective ends of the Fin type active pattern. Source/drain regions are grown, using the reduced-dimension Fin type active pattern ends as seeds for epitaxial growth of the source/drain regions. The reduced-dimension seeds (that is, the reduced-dimension fin type pattern ends) yield reduced-dimension source/drain regions which, in turn, allow for greater circuit density.

FIGS. 5 and 6 are views for explaining a semiconductor device according to a second exemplary embodiment in accordance with principles of inventive concepts. For brevity and convenience of explanation, the following description will focus on differences from the semiconductor device 1 shown in FIGS. 1 to 4 and descriptions of like elements will not be repeated here.

Referring to FIGS. 5 and 6, the semiconductor device 2 according to the second exemplary embodiment in accordance with principles of inventive concepts may further include first fin spacer 135.

In the semiconductor device 2 according to the second exemplary embodiment in accordance with principles of inventive concepts, a top surface 113u of a third part 113 of a first fin type active pattern 110 may upwardly protrude from a top surface 105u of a field insulation layer 105. That is, in this exemplary embodiment, the third part 113 of the first fin type active pattern 110 upwardly protrudes from the field insulation layer 105.

At a boundary between the third part 113 of the first fin type active pattern 110 and the top surface 105u of the field insulation layer 105, a width of the third part 113 of the first fin type active pattern 110 is smaller than a width of the top surface 113u of the third part 113 of the first fin type active pattern 110, but aspects of inventive concepts are not limited thereto.

The first fin spacer 135 is formed on sidewalls 113s of the third part 113 of the first fin type active pattern 110, upwardly protruding from the top surface 105u of the field insulation layer 105.

In the illustrated embodiment, the height ranging from the top surface 105u of the field insulation layer 105 to a topmost part of the first fin spacer 135 is equal to the height of the third part 113 of the first fin type active pattern 110, upwardly protruding from the top surface 105u of the field insulation layer 105, but aspects of inventive concepts are not limited thereto.

Because the first fin spacer 135 is formed on the protruding sidewalls 113s of the third part 113 of the first fin type active pattern 110, the first fin spacer 135 may extend in a first direction X1.

The first fin spacer 135 and a first gate spacer 140 formed at the same level on the sidewalls of the first gate electrode 120 and are physically connected to each other. The expression "being formed at the same level" is used to mean being formed by the same fabrication process, process step, and/or process layer.

The first fin spacer 135 may include, for example, at least one of silicon nitride (SiN), silicon oxynitride (SiON), silicon oxide ($SiO_2$), silicon oxycarbonitride (SiOCN) and combinations thereof. In the illustrated embodiment, the first fin spacer 135 is a single layer, but aspects of inventive concepts are not limited thereto; the first fin spacer 135 may have a multi-layered structure.

The first source/drain 130 is formed on the top surface 113u of the third part 113 of the first fin type active pattern 110 upwardly protruding from the top surface 105u of the field insulation layer 105.

FIGS. 7 to 9 are views for explaining a semiconductor device according to a third exemplary embodiment in accordance with principles of inventive concepts. For convenience and clarity of explanation, the following description will focus on differences from the semiconductor device 1 shown in FIGS. 1 to 4 and detailed description of like elements will not be repeated here.

Referring to FIGS. 7 to 9, in the semiconductor device 3 according to the third exemplary embodiment in accordance with principles of inventive concepts, a first fin type active pattern 110 and a fourth fin type active pattern 410 may extend lengthwise on a substrate 100 in a first direction X1. The first fin type active pattern 110 and the fourth fin type active pattern 410 are formed to be adjacent to each other with the field insulation layer 105 interposed therebetween.

The fourth fin type active pattern 410 upwardly protrudes from a field insulation layer 105 formed on the substrate 100. Like the first fin type active pattern 110, the fourth fin type active pattern 410 may be defined by the field insulation layer 105.

The fourth fin type active pattern 410 includes a first part 411, a second part 412 and a third part 413. The first part 411, the second part 412 and the third part 413 of the fourth fin type active pattern 410 may be sequentially arranged in the first direction X1, extending sequentially in both positive X1 and negative X1 directions from a center in first part 411.

In other words, the second part 412 of the fourth fin type active pattern 410 is disposed at opposite sides of the first part 411 of the fourth fin type active pattern 410 in the first direction X1 and the third part 413 of the fourth fin type active pattern 410 is disposed at opposite sides of the first part 411 of the fourth fin type active pattern 410 in the first direction X1, on opposite sides of second part 412.

As shown in FIGS. 7 and 9, a top surface of the first part 411 of the fourth fin type active pattern 410 and a top surface of the second part 412 of the fourth fin type active pattern 410 upwardly protrude from the top surface 105u of the field insulation layer 105. A top surface of the third part 413 of the fourth fin type active pattern 410 may not upwardly protrude from the top surface 105u of the field insulation layer 105, but aspects of inventive concepts are not limited thereto.

In exemplary embodiments the second part 412 of the fourth fin type active pattern 410 is recessed relative to the first part 411 of the fourth fin type active pattern 410 and the third part 413 of the fourth fin type active pattern 410 is recessed relative to the second part 412 of the fourth fin type active pattern 410.

That is, height h41 ranging from the top surface of the substrate 100 to the top surface of the first part 411 of the fourth fin type active pattern 410 is greater than height h42 ranging from the top surface of the substrate 100 to the top surface of the second part 412 of the fourth fin type active pattern 410. In addition, height h42 ranging from the top surface of the substrate 100 to the top surface of the second part 412 of the fourth fin type active pattern 410 is greater than height h43 ranging from the top surface of the substrate 100 to the top surface of the third part 413 of the fourth fin type active pattern 410.

A first gate electrode 120 may extend in a second direction Y1 and may cross the first fin type active pattern 110 and the fourth fin type active pattern 410. The first gate electrode 120 may be formed on the first fin type active pattern 110, the fourth fin type active pattern 410 and the field insulation layer 105. The first gate electrode 120 may be formed on the first part 111 of the first fin type active pattern 110 and the first part 411 of the fourth fin type active pattern 410.

A first gate spacer 140 may extend in the second direction Y1 and may be formed on the second part 112 of the first fin type active pattern 110 and the second part 412 of the fourth fin type active pattern 410.

A first gate insulation layer 125 may be formed between the first fin type active pattern 110 and the first gate electrode 120 and between the fourth fin type active pattern 410 and the first gate electrode 120. The first gate insulation layer 125 may be formed on the top surface and sidewalls of the first part 111 of the first fin type active pattern 110 and on the top surface and sidewalls of the first part 411 of the fourth fin type active pattern 410.

A fourth source/drain 430 is formed at opposite sides of the first gate electrode 120 on the fourth fin type active pattern 410. That is, the fourth source/drain 430 may be formed on the third part 413 of the fourth fin type active pattern 410.

In accordance with principles of inventive concepts, the outer circumferential surface of the fourth source/drain 430 may any of a variety of shapes, such as a diamond, a circle or a rectangle, for example. In FIG. 7, the fourth source/drain 430 having a diamond shape (or a pentagonal or hexagonal shape) is illustrated by way of example, but aspects of inventive concepts are not limited thereto.

The fourth source/drain 430 may have the same conductivity type as the first source/drain 130 and may include the same material as the first source/drain 130.

In the semiconductor device 3 according to the third exemplary embodiment in accordance with principles of inventive concepts, the fourth source/drain 430 may make contact with the first source/drain 130 to then be connected to the first source/drain 130. That is, the fourth source/drain 430 may be electrically connected to the first source/drain 130.

Because, in exemplary embodiments, the first source/drain 130 and the fourth source/drain 430 make contact with each other, an interlayer insulating layer 150 is not formed between the first source/drain 130 and the fourth source/drain 430 and an air gap 155 may be disposed therebetween.

A semiconductor device according to a fourth exemplary embodiment in accordance with principles of inventive concepts will now be described with reference to FIGS. 10 to 13.

FIG. 10 is a perspective view for explaining a semiconductor device according to a fourth exemplary embodiment in accordance with principles of inventive concepts, FIG. 11 illustrates cross-sectional views taken along lines A-A and E-E of FIG. 10, FIG. 12 illustrates cross-sectional views taken along lines C-C and F-F of FIG. 10 and FIG. 13 illustrates cross-sectional views taken along lines D-D and G-G of FIG. 10.

Referring to FIGS. 10 to 13, the semiconductor device 4 according to the fourth exemplary embodiment in accordance with principles of inventive concepts may include a substrate 100, a second fin type active pattern 210, a third fin type active pattern 310, a second gate electrode 220, a third gate electrode 320, a second gate spacer 240, a third gate spacer 340, a second source/drain 230 and a third source/drain 330.

The substrate 100 may include a first region I and a second region II, The first region I and the second region II may be connected to each other or may be spaced apart from each other, for example.

A first transistor 201 may be formed in the first region I and a second transistor 301 may be formed in the second region II.

In exemplary embodiments first transistor 201 includes a second fin type active pattern 210, a second gate electrode 220, a second gate spacer 240 and a second source/drain 230.

Because details of the second fin type active pattern 210 are substantially the same as those of the first fin type active pattern 110 shown in FIGS. 1 to 4, the second fin type active pattern 210 will now be briefly described.

The second fin type active pattern 210 may extend lengthwise in a third direction X2 on the substrate 100. The second fin type active pattern 210 upwardly protrudes from the field insulation layer 105 formed on the substrate 100. The second fin type active pattern 210 is defined by the field insulation layer 105.

The second fin type active pattern 210 includes a first part 211, a second part 212 and a third part 213. The first part 211, the second part 212 and the third part 213 of the second fin type active pattern 210 may be sequentially arranged in the third direction X2, extending sequentially in both positive X2 and negative X2 directions from a center in first part 211.

The second part 212 of the second fin type active pattern 210 and the third part 213 of the second fin type active pattern 210 are disposed at opposite sides of the first part 211 of the second fin type active pattern 210 in the third direction X2.

The top surface of the first part 211 of the second fin type active pattern 210 and the top surface of the second part 212 of the second fin type active pattern 210 upwardly protrude from the top surface 105u of the field insulation layer 105.

In exemplary embodiments in accordance with principles of inventive concepts the top surface 213u of the third part 213 of the second fin type active pattern 210 may not upwardly protrude from the top surface 105u of the field insulation layer 105, but aspects of inventive concepts are not limited thereto. That is, sidewalls of the third part 213 of the second fin type active pattern 210 may entirely make contact with, may be the same height as, the field insulation layer 105.

In exemplary embodiments height h4 ranging from the top surface of the substrate 100 to the top surface of the first part 211 of the second fin type active pattern 210 is greater than height h5 ranging from the top surface of the substrate 100 to the top surface of the second part 212 of the second fin type active pattern 210. In addition, height h5 ranging from the top surface of the substrate 100 to the top surface of the second part 212 of the second fin type active pattern 210 is greater than height h6 ranging from the top surface of the substrate 100 to the top surface of the third part 213 of the second fin type active pattern 210.

In exemplary embodiments the top surface of the first part 211 of the second fin type active pattern 210 and the top surface of the second part 212 of the second fin type active pattern 210 may not have a continuous profile. That is, there may be a step difference between the top surface of the first part 211 of the second fin type active pattern 210 and the second part 212 of the second fin type active pattern 210.

In the exemplary embodiment of FIG. 12, the width of second part 212 of the second fin type active pattern 210 upwardly protruding from the top surface 105u of the field insulation layer 105 is greater than the width of the second part 212 of the second fin type active pattern 210 making contact with the field insulation layer 105 on the second part 212 of the second fin type active pattern 210, but aspects of inventive concepts are not limited thereto.

The second gate electrode 220 may extend in a fourth direction Y2 and may be formed on the first part 211 of the second fin type active pattern 210. The second gate electrode 220 may include metal layers MG3 and MG4. As shown, the second gate electrode 220 may have two or more metal layers MG3 and MG4 stacked one on another. The second gate electrode 220 may include the same material included in the first gate electrode 120 shown in FIGS. 1 to 4, for example.

The second gate spacer 240 may be formed on sidewalls of the second gate electrode 220 in the fourth direction Y2. The second gate spacer 240 may be formed on the second part 212 of the second fin type active pattern 210.

The second gate insulation layer 225 may be formed between the second fin type active pattern 210 and the second gate electrode 220 and may be formed between the second gate spacer 240 and the second gate electrode 220. The second gate insulation layer 225 may include a high-k material having a higher dielectric constant than a silicon oxide layer, for example.

In exemplary embodiments second gate insulation layer 225 is formed on the first part 211 of the second fin type active pattern 210 and the second gate spacer 240 is formed on the second part 212 of the second fin type active pattern 210. Accordingly, the height of the second gate insulation layer 225 formed along sidewalls of the second gate spacer 240 on the top surface of the first part 211 of the second fin type active pattern 210 is smaller than the height of the second gate spacer 240 on the top surface of the second part 212 of the second fin type active pattern 210.

The second source/drain 230 is formed at opposite sides of the second gate electrode 220 on the second fin type active pattern 210. The second source/drain 230 is formed on the third part 213 of the second fin type active pattern 210.

In exemplary embodiments, the second source/drain 230 is formed on a top surface 213u of the third part 213 of the second fin type active pattern 210 and connecting sidewalls 212c of the second part 212 of the second fin type active pattern 210.

The second transistor 301 includes a third fin type active pattern 310, a third gate electrode 320, a third gate spacer 340 and a third source/drain 330.

The third fin type active pattern 310 may extend lengthwise on the substrate 100 in a fifth direction X3. The third fin type active pattern 310 upwardly protrudes from a field insulation layer 105 formed on the substrate 100. The third fin type active pattern 310 is defined by the field insulation layer 105.

The third fin type active pattern 310 may include a first part 311, a second part 312 and a third part 313. The first part 311, the second part 312 and the third part 313 of the third fin type active pattern 310 may be sequentially arranged in the fifth direction X3, extending sequentially in both positive X3 and negative X3 directions from a center in first part 311.

The second part 312 and the third part 313 of the third fin type active pattern 310 are disposed at opposite sides of the first part 311 of the third fin type active pattern 310 in the fifth direction X3.

The top surface of the first part 311 of the third fin type active pattern 310 and top surface of the second part 312 of the third fin type active pattern 310 upwardly protrude from the top surface 105u of the field insulation layer 105.

The top surface 313u of the third part 313 of the third fin type active pattern 310 may not upwardly protrude from the top surface 105u of the field insulation layer 105, but aspects of inventive concepts are not limited thereto. That is, sidewalls of the third part 313 of the third fin type active pattern 310 may entirely make contact with, may be the same height as, the field insulation layer 105.

In exemplary embodiments, height h7 ranging from the top surface of the substrate 100 to the top surface of the first part 311 of the third fin type active pattern 310 is greater than height h9 ranging from the top surface of the substrate 100 to the top surface of the third part 313 of the third fin type active pattern 310. Additionally, height h8 ranging from the top surface of the substrate 100 to the top surface of the second part 312 of the third fin type active pattern 310 is greater than height h9 ranging from the top surface of the substrate 100 to the top surface of the third part 313 of the third fin type active pattern 310.

In the semiconductor device 4 according to the fourth exemplary embodiment in accordance with principles of inventive concepts, height h7 ranging from the top surface of the substrate 100 to the top surface of the first part 311 of the third fin type active pattern 310 may be equal to height h8 ranging from the top surface of the substrate 100 to the top surface of the second part 312 of the third fin type active pattern 310.

That is, in exemplary embodiments the top surface of the first part 311 of the third fin type active pattern 310 and the top surface of the second part 312 of the third fin type active pattern 310 may have a continuous profile.

Additionally, as shown in the exemplary embodiment of FIG. 12, around a boundary between the second part 312 of the third fin type active pattern 310 and the top surface 105u of the field insulation layer 105, the width of the second part 312 of the third fin type active pattern 310 may not be sharply reduced.

The third gate electrode 320 may extend in a sixth direction Y3 and may be formed on the first part 311 of the third fin type active pattern 310. The third gate electrode 320 may include metal layers MG5 and MG6. In exemplary embodiments, as shown, the third gate electrode 320 may have two or more metal layers MG5 and MG6 stacked one on another. The third gate electrode 320 may include the same material included in the first gate electrode 120 shown in FIGS. 1 to 4.

The third gate spacer 340 may be formed on sidewalls of the third gate electrode 320 extending in the sixth direction Y3. The third gate spacer 340 may be formed on the second part 312 of the third fin type active pattern 310.

A third gate insulation layer 325 may be formed between the third fin type active pattern 310 and the third gate electrode 320. In addition, the third gate insulation layer 325 may be formed between the third gate spacer 340 and the third gate electrode 320 and may include a high-k material having a higher dielectric constant than a silicon oxide layer.

In exemplary embodiments the third gate insulation layer 325 is formed on the first part 311 of the third fin type active pattern 310 and the third gate spacer 340 is formed on the second part 312 of the third fin type active pattern 310.

Because height h7 ranging from the top surface of the substrate 100 to the top surface of the first part 311 of the third fin type active pattern 310 is equal to the range h8 ranging from the top surface of the substrate 100 to the top surface of the second part 312 of the third fin type active pattern 310, the height of the third gate insulation layer 325 formed along the sidewalls of the third gate spacer 340 on the top surface of the first part 311 of the third fin type active pattern 310 is substantially equal to the height of the third gate spacer 340 on the top surface of the second part 312 of the third fin type active pattern 310.

The third source/drain 330 is formed at opposite sides of the third gate electrode 320 on the third fin type active pattern 310. The third source/drain 330 is formed on the third part 313 of the third fin type active pattern 310.

That is, in exemplary embodiments the third source/drain 330 is formed on the top surface 313u of the third part 313 of the third fin type active pattern 310 and connecting sidewalls 312c of the second part 312 of the third fin type active pattern 310.

In the semiconductor device 4 according to the fourth exemplary embodiment in accordance with principles of inventive concepts, height h4 ranging from the top surface of the substrate 100 to the top surface of the first part 211 of the second fin type active pattern 210 may be substantially equal to the height h7 ranging from the top surface of the substrate 100 to the top surface of the first part 311 of the third fin type active pattern 310.

Accordingly, height h8 ranging from the top surface of the substrate 100 to the top surface of the second part 312 of the third fin type active pattern 310 is greater than height h5 ranging from the top surface of the substrate 100 to the top surface of the second part 212 of the second fin type active pattern 210.

In the semiconductor device 4 according to the fourth exemplary embodiment in accordance with principles of inventive concepts, width S2 of the third source/drain 330 extending in the sixth direction Y3 is greater width than width S1 of the second source/drain 230 extending in the fourth direction Y2 and height D2 of the third source/drain 330 is greater than height D1 of the second source/drain 230.

That is, in exemplary embodiments the second source/drain 230 is formed on the top surface 213u of the third part 213 of the second fin type active pattern 210 and on connecting sidewalls 212c of the second part 212 of the second fin type active pattern 210 and, height D1 of the second source/drain 230 is affected by the height of the second part 212 of the second fin type active pattern 210 upwardly protruding from the top surface 105u of the field insulation layer 105.

If height of the second part 212 of the second fin type active pattern 210 upwardly protruding from the top surface 105u of the field insulation layer 105 is increased, height D1 of the second source/drain 230 is increased. Conversely, if height of the second part 212 of the second fin type active pattern 210 upwardly protruding from the top surface 105u of the field insulation layer 105 is reduced, height D1 of the second source/drain 230 is reduced.

As a result, because the height of the second part 312 of the third fin type active pattern 310 upwardly protruding from the top surface 105u of the field insulation layer 105 is greater than the height of the second part 212 of the second fin type active pattern 210 upwardly protruding from the top surface 105u of the field insulation layer 105, height D2 of the third source/drain 330 may be greater than height D1 of the second source/drain 230.

Additionally, the second source/drain 230 and the third source/drain 330 may be, for example, epitaxial layers grown on the second fin type active pattern 210 and the third fin type active pattern 310, respectively. Although there may be some difference between facets according to growth conditions of the epitaxial layers, due to the development of the facets, the width S1 of the second source/drain 230 extending in the fourth direction Y2 is affected by height D1 of the second source/drain 230.

Consequently, because height D2 of the third source/drain 330 is greater than height D1 of the second source/drain 230, the width S2 of the third source/drain 330 extending in the sixth direction Y3 is greater than the width S1 of the second source/drain 230 extending in the fourth direction Y2. In exemplary embodiments in accordance with principles of inventive concepts, a source/drain region of smaller, or reduced, dimension (that is, shorter and narrower) may be produced using a reduced-height fin that serves as a seed in epitaxial growth of a source/drain region.

FIG. 14 is a cross-sectional view for explaining a semiconductor device according to a fifth exemplary embodiment in accordance with principles of inventive concepts. For clarity and convenience of explanation, the following description will focus on differences from the semiconductor device shown in FIGS. 10 to 13. Here, FIG. 14 is a cross-sectional view taken along lines A-A and E-E of FIG. 10.

Referring to FIG. 14, in the semiconductor device 5 according to the fifth exemplary embodiment in accordance with principles of inventive concepts, height h4 ranging from a top surface of a substrate 100 to a top surface of a first part 211 of a second fin type active pattern 210 may be equal to height h5 ranging from the top surface of the substrate 100 to a top surface of a second part 212 of the second fin type active pattern 210.

That is, in exemplary embodiments the top surface of the first part 211 of the second fin type active pattern 210 and the top surface of the second part 212 of the second fin type active pattern 210 may have a continuous profile.

Additionally, a cross-sectional view of the first part 211 of the second fin type active pattern 210, taken along the Y2-Z2 plane, may be similar to the cross-sectional view taken along the line C-C of FIG. 12.

In the semiconductor device 5 according to the fifth exemplary embodiment in accordance with principles of inventive concepts, height h7 ranging from the top surface of the substrate 100 to a top surface of a first part 311 of a third fin type active pattern 310 is greater than height h4 ranging from the top surface of the substrate 100 to the top surface of the first part 211 of the second fin type active pattern 210.

Additionally, height h8 ranging from the top surface of the substrate 100 to a top surface of a second part 312 of the third fin type active pattern 310 is greater than the height ranging from the top surface of the substrate 100 to the top surface of the second part 212 of the second fin type active pattern 210.

Therefore, the height of the third fin type active pattern 310 upwardly protruding from a field insulation layer 105 is greater than the height of the second fin type active pattern 210 upwardly protruding from the field insulation layer 105.

In such exemplary embodiments the width S2 of a third source/drain 330 extending in a sixth direction Y3 is greater than the width Si of the second source/drain 230 extending in a fourth direction Y2 and height D2 of the third source/drain 330 is greater than height D1 of the second source/drain 230.

FIGS. 15 to 17 are views for explaining a semiconductor device according to a sixth exemplary embodiment in accordance with principles of inventive concepts. For clarity and convenience of explanation, the following description will focus on differences from the semiconductor device shown in FIGS. 10 to 13.

Specifically, FIG. 15 is a perspective view for explaining a semiconductor device according to a sixth exemplary embodiment in accordance with principles of inventive concepts, FIG. 16 is a cross-sectional view taken along lines A-A and E-E of FIG. 15, and FIG. 17 is a cross-sectional view taken along lines D-D and G-G of FIG. 15.

Referring to FIGS. 15 to 17, the semiconductor device 6 according to the sixth exemplary embodiment in accordance with principles of inventive concepts may further include a second fin spacer 235, such as that of a first transistor 201, for example.

In the semiconductor device 6 according to the sixth exemplary embodiment in accordance with principles of inventive concepts, a top surface 213u of a third part 213 of a second fin type active pattern 210 may upwardly protrude from a top surface 105u of a field insulation layer 105. That is, the third part 213 of the second fin type active pattern 210 may upwardly protrude from the field insulation layer 105.

In the illustrated embodiment, the width of the third part 213 of the second fin type active pattern 210 is less than the width of the top surface 213u of the third part 213 of the second fin type active pattern 210 at a boundary between the third part 213 of the second fin type active pattern 210 and the top surface 105u of the field insulation layer 105, but aspects of inventive concepts are not limited thereto.

The second fin spacer 235 is formed on sidewalls of the third part 213 of the second fin type active pattern 210 upwardly protruding from the top surface 105u of the field insulation layer 105.

The height ranging from the top surface 105u of the field insulation layer 105 to a topmost part of the second fin spacer 235 is equal to the height of the third part 213 of the second fin type active pattern 210 upwardly protruding from the top surface 105u of the field insulation layer 105, but aspects of inventive concepts are not limited thereto.

Because the second fin spacer 235 is formed on the sidewalls of the third part 213 of the second fin type active pattern 210, it may extend in a third direction X2.

The second fin spacer 235 and a second gate spacer 240 formed on sidewalls of a second gate electrode 220 are physically connected to each other and the second fin spacer 235 and the second gate spacer 240 may include the same material.

FIG. 18 is a cross-sectional view for explaining a semiconductor device according to a seventh exemplary embodiment in accordance with principles of inventive concepts. For clarity and convenience of explanation, the following description will focus on differences from the semiconductor device shown in FIGS. 15 to 17.

In exemplary embodiments in which the third source/drain 330 has a reduced, size as in FIG. 15, a perspective view of the semiconductor device according to the seventh exemplary embodiment in accordance with principles of inventive concepts may be substantially the same with the perspective view of FIG. 15. Here, FIG. 18 is a cross-sectional view taken along lines A-A and E-E of FIG. 15.

Referring to FIG. 18, in the semiconductor device 7 according to the seventh exemplary embodiment in accordance with principles of inventive concepts, height h7 ranging from a top surface of a substrate 100 to a top surface of a first part 311 of a third fin type active pattern 310 may be greater than height h8 ranging from the top surface of the substrate 100 to a top surface of a second part 312 of the third fin type active pattern 310.

In the semiconductor device 7 according to the seventh exemplary embodiment in accordance with principles of inventive concepts, height h4 ranging from the top surface of the substrate 100 to a top surface of a first part 211 of a second fin type active pattern 210 may be equal to height h7 ranging from the top surface of the substrate 100 to the top surface of the first part 311 of the third fin type active pattern 310 and height h5 ranging from the top surface of the substrate 100 to a top surface of a second part 212 of the second fin type active pattern 210 may be equal to height h8 ranging from the top surface of the substrate 100 to the top surface of the second part 312 of the third fin type active pattern 310.

In exemplary embodiments, although top surface 213u of the third part 213 of the second fin type active pattern 210 upwardly protrudes from a top surface 105u of a field insulation layer 105, a top surface 313u of the third part 313 of the third fin type active pattern 310 may not upwardly protrude from the top surface 105u of the field insulation layer 105. That is, sidewalls of the third part 313 of the third fin type active pattern 310 may entirely make contact with the field insulation layer 105.

In such exemplary embodiments, height h6 ranging from the top surface of the substrate 100 to the top surface 213u of the third part 213 of the second fin type active pattern 210 is greater than height h9 ranging from the top surface of the substrate 100 to the top surface 313u of the third part 313 of the third fin type active pattern 310.

In other words, the height of connecting sidewalls 212c of the second part 212 of the second fin type active pattern 210, on which a second source/drain 230 is formed, is less than the height of connecting sidewalls 312c of the second part 312 of the third fin type active pattern 310, on which a third source/drain 330 is formed.

And, as a result, the width of the third source/drain 330 in a sixth direction Y3 may be greater than the width of the second source/drain 230 in a fourth direction Y2 and the height of the third source/drain 330 may be greater than the height of the second source/drain 230.

FIGS. 19 and 21 are views for explaining a semiconductor device according to an eighth exemplary embodiment in accordance with principles of inventive concepts. For clarity and convenience of explanation, the following description will focus on differences from the semiconductor device shown in FIGS. 10 to 13.

In particular, FIG. 20 is a cross-sectional view taken along lines J-J and K-K of FIG. 19 and FIG. 21 is a cross-sectional view taken along lines D-D and G-G of FIG. 19. A cross-sectional view taken along the lines A-A and E-E of FIG. 19 may be the same with the cross-sectional view of FIG. 11.

Referring to FIGS. 19 to 21, in the semiconductor device 8 according to the eighth exemplary embodiment in accordance with principles of inventive concepts, a second fin type active pattern 210 and a fifth fin type active pattern 260 may extend lengthwise on a substrate 100 in a third direction X2. The second fin type active pattern 210 and the fifth fin type active pattern 260 are formed to be adjacent to each other with a field insulation layer 105 interposed therebetween.

A third fin type active pattern 310 and a sixth fin type active pattern 360 may extend lengthwise on the substrate 100 in a fifth direction X3. The third fin type active pattern 310 and the sixth fin type active pattern 360 are formed to be adjacent to each other with the field insulation layer 105 interposed therebetween.

In exemplary embodiments fifth fin type active pattern 260 and the sixth fin type active pattern 360 upwardly protrude from the field insulation layer 105 formed on the substrate 100 and are defined by the field insulation layer 105.

The fifth fin type active pattern 260 includes a first part 261, a second part 262 and a third part 263. The first part 261, the second part 262 and the third part 263 of the fifth fin type active pattern 260 may be sequentially arranged in the third direction X2, extending sequentially in both positive X2 and negative X2 directions from a center in first part 261.

The sixth fin type active pattern 360 includes a first part 361, a second part 362 and a third part 363. The first part 361, the second part 362 and the third part 363 of the sixth fin type active pattern 360 may be sequentially arranged in the fifth direction X3, extending sequentially in both positive X3 and negative X3 directions from a center in first part 361.

Like the second fin type active pattern 210, the second part 262 of the fifth fin type active pattern 260 is recessed relative to the first part 261 of the fifth fin type active pattern 260 and the third part 263 of the fifth fin type active pattern 260 is recessed relative to the second part 262 of the fifth fin type active pattern 260.

However, in exemplary embodiments details of the sixth fin type active pattern 360 may be substantially the same with those of the third fin type active pattern 310.

In other words, the height ranging from the top surface of the substrate 100 to a top surface of the first part 361 of the sixth fin type active pattern 360 is greater than the height ranging from the top surface of the substrate 100 to a top surface of the third part 363 of the sixth fin type active pattern 360. In addition, the height ranging from the top surface of the substrate 100 to a top surface of the second part 362 of the sixth fin type active pattern 360 is greater than the height ranging from the top surface of the substrate 100 to the top surface of the third part 363 of the sixth fin type active pattern 360.

However, the height ranging from the top surface of the substrate 100 to the top surface of the first part 361 of the sixth fin type active pattern 360 may be equal to the height ranging from the top surface of the substrate 100 to the top surface of the second part 362 of the sixth fin type active pattern 360. That is, the top surface of the first part 361 of the sixth fin type active pattern 360 and the top surface of the second part 362 of the sixth fin type active pattern 360 may be coplanarly positioned.

A second gate electrode 220 may extend in a fourth direction Y2 and may be formed on the first part 211 of the second fin type active pattern 210 and the first part 261 of the fifth fin type active pattern 260. A third gate electrode 320 may extend in a sixth direction Y3 and may be formed on the first part 311 of the third fin type active pattern 310 and the first part 361 of the sixth fin type active pattern 360.

A second gate spacer 240 may extend in the fourth direction Y2 and may be formed on the second part 212 of the second fin type active pattern 210 and the second part 262 of the fifth fin type active pattern 260. A third gate spacer 340 may extend in the sixth direction Y3 and may be formed on the second part 312 of the third fin type active pattern 310 and the second part 362 of the sixth fin type active pattern 360.

In exemplary embodiments fifth source/drain 280 is formed at opposite sides of the second gate electrode 220 on the fifth fin type active pattern 260. That is, the fifth source/drain 280 may be formed on the third part 263 of the fifth fin type active pattern 260.

A sixth source/drain 380 is formed at opposite sides of the third gate electrode 320 on the sixth fin type active pattern 360. That is, the sixth source/drain 380 may be formed on the third part 363 of the sixth fin type active pattern 360.

The fifth source/drain 280 may have the same conductivity type as the second source/drain 230 and may include the same material as the second source/drain 230. Likewise, the sixth source/drain 380 may have the same conductivity type as the third source/drain 330 and may include the same material with the third source/drain 330.

In the semiconductor device 8 according to the eighth exemplary embodiment in accordance with principles of inventive concepts, the second source/drain 230 and the fifth source/drain 280 may not be connected to each other but may be spaced apart from each other. However, the third source/drain 330 and the sixth source/drain 380 may make contact with each other to then be connected to each other.

In exemplary embodiments, the distance between the second fin type active pattern 210 and the fifth fin type active pattern 260 may be equal to the distance between the third fin type active pattern 310 and the sixth fin type active pattern 360.

Additionally, as described above with reference to FIG. 13, the width of the second source/drain 230 in the fourth direction Y2 is smaller than the width of the third source/drain 330 in the sixth direction Y3. Similarly, the width of the fifth source/drain 280 in the fourth direction Y2 is smaller than the width of the sixth source/drain 380 in the sixth direction Y3.

As a result, in exemplary embodiments the third source/drain 330 and the sixth source/drain 380 having relatively large widths in the sixth direction Y3 may make contact with each other to then be connected to each other. However, the second source/drain 230 and the fifth source/drain 280 having relatively small widths in the fourth direction Y2 may be spaced apart from each other.

FIGS. 22 and 23 are a circuit view and a layout view for explaining a semiconductor device according to a ninth exemplary embodiment in accordance with principles of inventive concepts.

Referring to FIG. 22, the semiconductor device 9 according to the ninth exemplary embodiment in accordance with principles of inventive concepts may include a pair of inverters INV1 and INV2 connected in parallel between a power supply node Vcc and a ground node Vss, and a first pass transistor PS1 and a second pass transistor PS2 connected to output nodes of the inverters INV1 and INV2. The first and second pass transistors PS1, PS2 may be respectively connected to bit line BL and a complementary bit line/BL. Gates of the first and second pass transistors PS1, PS2 may be connected to word line WL.

The first inverter INV1 includes a first pull-up transistor PU1 and a first pull-down transistor PD1 connected in series to each other, and the second inverter INV2 includes a second pull-up transistor PU2 and a second pull-down transistor PD2 connected in series to each other. The first pull-up transistor PU1 and the second pull-up transistor PU2 may be PMOS transistors, and the first pull-down transistor PD1 and the second pull-down transistor PD2 may be NMOS transistors.

In exemplary embodiments, in order to constitute a latch circuit, an input node of the first inverter INV1 is connected to an output node of the second inverter INV2 and an input node of the second inverter INV2 is connected to an output node of the first inverter INV1.

Referring to FIGS. 22 and 23, a seventh fin type active pattern 510, an eighth fin type active pattern 520, a ninth fin type active pattern 530 and a tenth fin type active pattern 540, which are spaced apart from one another, may extend lengthwise in one direction (e.g., in an up-down direction of FIG. 23). The eighth fin type active pattern 520 and the ninth fin type active pattern 530 may extend in shorter lengths than the seventh fin type active pattern 510 and the tenth fin type active pattern 540.

The fifth gate electrode 551, the sixth gate electrode 552, the seventh gate electrode 553 and the eighth gate electrode 554 may extend lengthwise in the other direction (that is, in the left-right direction of FIG. 23) and may be formed to intersect the seventh to tenth fin type active patterns 510 to 540. In exemplary embodiments, the fifth gate electrode 551 completely intersects the seventh fin type active pattern 510 and the eighth fin type active pattern 520, while partially overlapping with a terminal of the ninth fin type active pattern 530. The seventh gate electrode 553 completely intersects the tenth fin type active pattern 540 and the ninth fin type active pattern 530, while partially overlapping with a terminal of the eighth fin type active pattern 520. The sixth gate electrode 552 and the eighth gate electrode 554 are formed to intersect the seventh fin type active pattern 510 and the tenth fin type active pattern 540, respectively.

In exemplary embodiments, the first pull-up transistor PU1 is defined in the vicinity of the intersection of the fifth gate electrode 551 and the eighth fin type active pattern 520, the first pull-down transistor PD1 is defined in the vicinity of the intersection of the fifth gate electrode 551 and the seventh fin type active pattern 510, the first pass transistor PS1 is defined in the vicinity of the intersection of the sixth gate electrode 552 and the seventh fin type active pattern 510, the second pull-up transistor PU2 is defined in the vicinity of the intersection of the seventh gate electrode 553 and the ninth fin type active pattern 530, the second pull-down transistor PD2 is defined in the vicinity of the intersection of the seventh gate electrode 553 and the tenth fin type active pattern 540, and the second pass transistor PS2 is defined in the vicinity of the intersection of the gate electrode 554 and the tenth fin type active pattern 540.

Although not specifically shown, in accordance with principles of inventive concepts, recesses may be formed at opposite sides of the respective intersections of the fifth to eighth gate electrodes 551-554 and the seventh to tenth fins 510, 520, 530 and 540, and sources/drains may be formed in the recesses.

A plurality of contacts 550 may be formed.

A shared contact 561 may simultaneously connect the eighth fin 520, the seventh gate electrode 553, and a wiring 571 with one another. Another shared contact 562 may simultaneously connect the ninth fin 530, the fifth gate electrode 551 and a wiring 572 with one another.

The first pull-up transistor PU1, the first pull-down transistor PD1, the first pass transistor PS1, the second pull-up transistor PU2, the second pull-down transistor PD2, and the second pass transistor PS2 may all be fin type transistors and may have a configuration such as described in the discussion related to FIGS. 10 to 21.

For example, a cross-sectional view of the first pull-up transistor PU1, taken along the line H-H, may be substantially the same as a cross-sectional view taken along the line A-A of FIGS. 11, 14, 16 and 18; a cross-sectional view of the first pull-down transistor PD1, taken along the line I-I, may be substantially the same as a cross-sectional view taken along the line E-E of FIGS. 11, 14, 16 and 18; and the first pass transistor PS1 and the first pull-down transistor PD1 may have substantially the same cross section.

FIG. 24 is a conceptual diagram for explaining a semiconductor device according to a tenth exemplary embodiment in accordance with principles of inventive concepts.

Referring to FIG. 24, in the semiconductor device 10 according to the tenth exemplary embodiment in accordance with principles of inventive concepts, a first fin type transistor 611 may be disposed in an SRAM region 610 and a second fin type transistor 621 may be disposed in a logic region 620.

In exemplary embodiments in accordance with principles of inventive concepts, first fin type transistor 611 may correspond to the first transistor 201 shown in FIGS. 10 to 17 and 19 to 21 and the second fin type transistor 621 may correspond to the second transistor 301 shown in FIGS. 10 to 17 and 19 to 21.

Because, in such exemplary embodiments, source/drain of the first fin type transistor 611 has a smaller size (e.g., width, height or volume) than a source/drain of the second fin type transistor 621, higher device density may be achieved in the SRAM region 610, for example.

Hereinafter, a method for fabricating a semiconductor device according to an exemplary embodiment in accordance with principles of inventive concepts will be described with reference to FIGS. 25 to 32. The semiconductor device fabricated through process steps shown in FIGS. 25 to 32 may be a semiconductor device such as device 4 shown in FIGS. 10 to 13, for example.

FIGS. 25 to 32 illustrate intermediate process steps in a method for fabricating a semiconductor device according to an exemplary embodiment in accordance with principles of inventive concepts.

Referring to FIG. 25, a first pre-fin type active pattern 210p is formed in a first region I on a substrate 100 and a second pre-fin type active pattern 310p is formed in a second region II on the substrate 100.

In exemplary embodiments, a first mask pattern 2103a and a second mask pattern 2103b are formed in the first region I and the second region II on the substrate 100, respectively, and an etching process is then performed thereon to form the first pre-fin type active pattern 210p and the second pre-fin type active pattern 310p.

The first pre-fin type active pattern 210p may extend in a third direction X2 and the second pre-fin type active pattern 310p may extend in a fifth direction X3. Trenches are formed in vicinity of the first pre-fin type active pattern 210p and the second pre-fin type active pattern 310p, respectively. The first mask pattern 2103a and the second mask pattern 2103b may include, for example, at least one of silicon oxide, silicon nitride and silicon oxynitride.

Referring to FIG. 26, a field insulation layer 105 is formed on the substrate 100. The field insulation layer 105 may include, for example, at least one of silicon oxide, silicon nitride and silicon oxynitride, for example.

In exemplary embodiments, the field insulation layer 105, covering the first pre-fin type active pattern 210p and the second pre-fin type active pattern 310p, is formed on the substrate 100. Through a planarizing process, the second fin type active pattern 210, the third fin type active pattern 310 and the field insulation layer 105 may be coplanarly positioned. As the result of the planarizing process, the first mask pattern 2103a and the second mask pattern 2103b may be removed, but aspects of inventive concepts are not limited thereto. That is, the first mask pattern 2103a and the second mask pattern 2103b may be removed before the forming of the field insulation layer 105 or after the field insulation layer 105 is recessed in a subsequent process, for example.

Next, in exemplary embodiments a portion of the field insulation layer 105 is recessed. As the result, the second fin type active pattern 210 and the third fin type active pattern 310 upwardly protrude from a top surface of the field insulation layer 105. That is, the field insulation layer 105 is formed to make contact with portions of sidewalls of the second fin type active pattern 210 and the third fin type active pattern 310.

As a result, the second fin type active pattern 210 and the third fin type active pattern 310 may be defined by the field insulation layer 105. The second fin type active pattern 210 may include a first part 211, a second part 212 and a third part 213 sequentially arranged in a third direction X2. The third fin type active pattern 310 may include a first part 311, a second part 312 and a third part 313 sequentially arranged in a fifth direction X3.

Portions of the second and third fin type active patterns 210 and 310 upwardly protruding from the field insulation layer 105 may be formed by an epitaxial process. In exemplary embodiments, after the forming of the field insulation layer 105 through the planarizing process, epitaxial processes may be performed using top surfaces of the second and third fin type active patterns 210 and 310 exposed by the field insulation layer 105 as seeds, without recessing the field insulation layer 105. As the result of the epitaxial process, the portions of the second and third fin type active patterns 210 and 310 may be formed, respectively.

In exemplary embodiments, doping for adjusting a threshold voltage may be performed on each of the second fin type active pattern 210 and the third fin type active pattern 310. For example, in a case of forming an NMOS fin type transistor using the second fin type active pattern 210, a doped impurity may be boron (B), and in a case of forming a PMOS fin type transistor using the second fin type active pattern 210, a doped impurity may be phosphorus (P) or arsenic (As). The impurity doped may vary according to the type of a fin type transistor formed using the third fin type active pattern 310.

Referring to FIG. 27, an etching process is performed using the third mask pattern 2104a, thereby forming a first dummy gate pattern 226 extending in a fourth direction Y2 and crossing the second fin type active pattern 210. In addition, an etching process is performed using the fourth mask pattern 2104b, thereby forming a second dummy gate pattern 326 extending in a sixth direction Y3 and crossing the third fin type active pattern 310.

In exemplary embodiments, the first dummy gate pattern 226 may be formed on the first part 211 of the second fin type active pattern 210 and the second dummy gate pattern 326 may be formed on the first part 311 of the third fin type active pattern 310.

In exemplary embodiments first dummy gate pattern 226 includes a first dummy gate insulation layer 227 and a first dummy gate electrode 228 and second dummy gate pattern 326 includes a second dummy gate insulation layer 327 and a second dummy gate electrode 328. The first dummy gate insulation layer 227 and the second dummy gate insulation layer 327 may include silicon oxide and the first dummy gate electrode 228 and the second dummy gate electrode 328 may include polysilicon, for example.

In a method for fabricating a semiconductor device according to an exemplary embodiment in accordance with principles of inventive concepts, in order to form a replacement gate electrode, a first dummy gate pattern 226 and a second dummy gate pattern 326 are formed, but aspects of inventive concepts are not limited thereto. That is, a gate pattern, rather than a dummy gate pattern, may be formed using a material to be used as a gate insulation layer and a gate electrode of a transistor.

Although not shown, a protection layer covering the first dummy gate pattern 226, the second dummy gate pattern 326, the second fin type active pattern 210 and the third fin type active pattern 310 may be formed. The protection layer may serve to prevent the first dummy gate electrode 228 of the first dummy gate pattern 226 from being exposed in a subsequent trimming process.

Referring to FIG. 28, a blocking pattern 20 covering the second region II is formed. Because the blocking pattern 20 is formed only in the second region II, the first region I is exposed by the blocking pattern 20.

In exemplary embodiments blocking pattern 20 is formed on the field insulation layer 105 and covers the second dummy gate pattern 326 and the third fin type active pattern 310.

The first dummy gate pattern 226 and the second fin type active pattern 210 formed in the first region I are exposed.

Referring to FIG. 29, in the first region I, the second part 212 of the second fin type active pattern 210 and the third part 213 of the second fin type active pattern 210, upwardly protruding from the top surface of the field insulation layer 105, are trimmed using the first dummy gate pattern 226 as a mask.

The trimming of the second part 212 of the second fin type active pattern 210 and the third part 213 of the second fin type active pattern 210 includes reducing heights and widths of the second part 212 of the second fin type active pattern 210 and the third part 213 of the second fin type active pattern 210, upwardly protruding from the top surface of the field insulation layer 105.

In exemplary embodiments, trimming the second fin type active pattern 210 may be performed using, for example, an etching process 30. For example, the etching process 30 may be performed using a material having etching selectivity to the second fin type active pattern 210. In exemplary embodiments in accordance with principles of inventive concepts, as the result of the etching process 30, only the second part 212 and the third part 213 of the second fin type active pattern 210 are etched while not etching the field insulation layer 105.

Next, the blocking pattern 20 covering the second region II is removed.

Referring to FIG. 30, a second gate spacer 240 is formed on sidewalls of the first dummy gate pattern 226 and a third gate spacer 340 is formed on sidewalls of the second dummy gate pattern 326.

The second gate spacer 240 may be formed on the second part 212 of the second fin type active pattern 210 and the third gate spacer 340 may be formed on the second part 312 of the third fin type active pattern 310.

In exemplary embodiments, a spacer layer, covering the first dummy gate pattern 226, the second dummy gate pattern 326, the second fin type active pattern 210 and the third fin type active pattern 310, is formed. Thereafter, an etch-back process forms the second gate spacer 240 and the third gate spacer 340.

In addition, portions of the third part 213 of the second fin type active pattern 210 exposed at opposite sides of the first dummy gate pattern 226 are removed using the first dummy gate pattern 226 as a mask, thereby forming a first recess 230r in the third part 213 of the second fin type active pattern 210.

Portions of the third part 313 of the third fin type active pattern 310 exposed at opposite sides of the second dummy gate pattern 326 are removed using the second dummy gate pattern 326 as a mask, thereby forming a second recess 330r in the third part 313 of the third fin type active pattern 310.

In exemplary embodiments, height h22 of the second part 312 of the third fin type active pattern 310 exposed by the second recess 330r is greater than height h21 of the second part 212 of the second fin type active pattern 210 exposed by the first recess 230r.

In exemplary embodiments the second part 212 of the second fin type active pattern 210 is trimmed to have a reduced height, while the second part 312 of the third fin type active pattern 310 is not trimmed.

Referring to FIG. 31, a second source/drain 230 filling the first recess 230r is formed on the third part 213 of the second fin type active pattern 210.

A third source/drain 330 filling the second recess 330r is formed on the third part 313 of the third fin type active pattern 310.

The second source/drain 230 and the third source/drain 330 may be formed by, for example, an epitaxial growth process.

Referring to FIG. 32, an interlayer insulating layer 150, covering the second source/drain 230, the third source/drain 330, the first dummy gate pattern 226 and the second dummy gate pattern 326, is formed on the field insulation layer 105.

The interlayer insulating layer 150 may include, for example, at least one of a low-k material, an oxide layer, a nitride layer and an oxynitride layer. Examples of the low-k material may include flowable oxide (FOX), Tonen silazene (TOSZ), undoped silicate glass (USG), borosilica glass (BSG), phosphosilaca glass (PSG), borophosphor silica glass (BPSG), plasma enhanced tetraethyl orthosilicate (PE-TEOS), fluoride silicate glass (FSG), high density plasma (HDP) oxide, plasma enhanced oxide (PEOX), flowable CVD (FCVD), or combinations thereof, for example.

Next, the interlayer insulating layer 150 is planarized until top surfaces of the first dummy gate electrode 228 and the second dummy gate electrode 328 are exposed. As a result, the third mask pattern 2104a and the fourth mask pattern 2104b may be removed and the top surfaces of the first dummy gate electrode 228 and the second dummy gate electrode 328 may then be exposed.

Next, the first dummy gate pattern 226 and the second dummy gate pattern 326 are removed. Spaces formed by removing the first dummy gate pattern 226 and the second dummy gate pattern 326 are filled, thereby forming the second gate electrode 220 and the third gate electrode 320 shown in FIG. 10.

Next, a method for fabricating a semiconductor device according to another exemplary embodiment in accordance with principles of inventive concepts will be described with reference to FIGS. 25 to 27 and 30 to 34. The semiconductor device fabricated through process steps shown in FIGS. 25 to 27 and 30 to 34 may be one such as the exemplary embodiment of the semiconductor device 5 shown in FIG. 14.

FIGS. 33 and 34 illustrate intermediate process steps in a method for fabricating a semiconductor device according to another exemplary embodiment in accordance with principles of inventive concepts.

Referring to FIG. 33, a blocking pattern 20 covering the second region II is formed. Since the blocking pattern 20 is formed only in the second region II, the first region I is exposed by the blocking pattern 20 (that is, left exposed).

The blocking pattern 20 is formed on the field insulation layer 105. The blocking pattern 20 covers a third fin type active pattern 310, while the second fin type active pattern 210 formed in the first region I is exposed.

Referring to FIG. 34, the second fin type active pattern 210 upwardly protruding from the top surface of the field insulation layer 10 is trimmed using the blocking pattern 20 as a mask. In exemplary embodiments, the first part 211, the second part 212 and the third part 213 of the second fin type active pattern 210 are trimmed.

The trimming of the second fin type active pattern 210 includes reducing the height and width of the second fin type active pattern 210 upwardly protruding from the top surface of the field insulation layer 105.

Next, the blocking pattern 20 covering the second region II is removed.

Referring to FIGS. 27 and 30 to 32, an etching process using the third mask pattern 2104a, forms the first dummy gate pattern 226 extending in the fourth direction Y2 on the first part 211 of the second fin type active pattern 210. In addition, an etching process using the fourth mask pattern 2104b, forms the second dummy gate pattern 326 extending in the sixth direction Y3 on the first part 311 of the third fin type active pattern 310.

Next, a second gate spacer 240 is formed on the second part 212 of the second fin type active pattern 210 and a third gate spacer 340 is formed on the second part 312 of the third fin type active pattern 310.

A first recess 230r is formed in the third part 213 of the second fin type active pattern 210 using the first dummy gate pattern 226 as a mask, and a second recess 330r is formed in the third part 313 of the third fin type active pattern 310 using the second dummy gate pattern 326 as a mask.

A second source/drain 230 filling the first recess 230r is formed on the third part 213 of the second fin type active pattern 210. A third source/drain 330 filling the second recess 330r is formed on the third part 313 of the third fin type active pattern 310.

FIG. 35 is a block diagram of an electronic system including a semiconductor in accordance with principles of inventive concepts.

Referring to FIG. 35, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or commands. The interface 1140 may perform functions of transmitting data to a communication network or receiving data from the communication network. The interface 1140 may be wired or wireless. For example, the interface 1140 may include an antenna or a wired/wireless transceiver, and so on.

Although not shown, the electronic system 1100 may further include high-speed DRAM and/or SRAM as the working memory for improving the operation of the controller 1110.

The electronic system 1100 may be applied to a personal digital assistant (PDA), a portable computer, a web tablet, a wireless phone, a mobile phone, a digital music player, a memory card, or any type of electronic device capable of transmitting and/or receiving information in a wireless environment. The semiconductor devices according to the embodiments of the present inventive concept may be provided in the memory device 1130 or may be provided some components of the controller 1110 or the I/O 1120.

FIGS. 36 and 37 illustrate exemplary semiconductor systems to which a semiconductor device in accordance with principles of inventive concepts may be employed. In particular, FIG. 36 illustrates an exemplary embodiment in which a semiconductor device in accordance with principles of inventive concepts is applied to a tablet PC and FIG. 37 illustrates an exemplary embodiment in which a semiconductor device in accordance with principles of inventive concepts is applied to a notebook computer. A semiconductor device in accordance with principles of inventive concepts, such as the exemplary embodiments of semiconductor devices 1 to 10 may be employed in a tablet PC, a notebook computer, and other portable electronic devices, such as smartphones and phablets, for example. In addition, semiconductor devices in accordance with principles of inventive concepts may also be applied to other IC devices not illustrated herein.

While inventive concepts have been particularly shown and described with reference to exemplary embodiments thereof, it will be understood that various changes in form and details may be made therein without departing from the spirit and scope of inventive concepts as defined by the following claims. It is therefore desired that the present embodiments be considered in all respects as illustrative and not restrictive, reference being made to the appended claims, rather than the foregoing description to indicate the scope of inventive concepts.

What is claimed is:

1. A method for fabricating a semiconductor device, the method comprising:
   forming a fin type active pattern defined by a field insulation layer, extending in a first direction, including first to third parts sequentially arranged in the first direction and upwardly protruding from a top surface of the field insulation layer;
   forming a dummy gate electrode extending in a second direction different from the first direction and crossing the fin type active pattern on the first part;
   trimming the second and third parts upwardly protruding from the top surface of the field insulation layer using the dummy gate electrode as a mask;
   forming a gate spacer formed on the second part and sidewalls of the dummy gate electrode after the trimming the second and third parts;
   forming a recess in the third part using the dummy gate electrode as a mask; and
   forming a source/drain filling the recess on the third part,
   wherein the second and third parts upwardly protrude from the top surface of the field insulation layer between the forming the gate spacer and after the trimming the second and third parts.

2. The method of claim 1, wherein the trimming reduces heights and widths of the second part and the third part.

3. The method of claim 1, wherein the forming the recess includes covering sidewalls of the third part with field insulation layer.

4. The method of claim 1, wherein the first part, the second part and the third part have the same width at a boundary between the field insulation layer and the fin type active pattern.

5. The method of claim 1, wherein the first part has a greater width than the second part at a first height from a top surface of the field insulation layer.

6. The method of claim 1, wherein a top surface of the second part and a top surface of the first part have discontinuous profiles, and opposite sidewalls of the second part facing each other in the second direction and opposite sidewalls of the first part facing each other in the second direction have discontinuous profiles.

7. The method of claim 6, wherein the first part includes connecting sidewalls, and
   wherein the connecting sidewalls connect the top surface of the first part and the top surface of the second part and connect the opposite sidewalls of the first part and the opposite sidewalls of the second part.

8. The method of claim 7, wherein the gate spacer overlaps the connecting sidewalls.

9. The method of claim 1, further comprising forming a fin spacer on the sidewalls of the third part upwardly protruding from the top surface of the field insulation layer.

10. A method for fabricating a semiconductor device, the method comprising:
    forming a fin type active pattern defined by a field insulation layer, extending in a first direction, including first to third parts sequentially arranged in the first direction and upwardly protruding from a top surface of the field insulation layer;
    trimming the fin type active pattern upwardly protruding from the top surface of the field insulation layer;
    forming a dummy gate electrode extending in a second direction different from the first direction and crossing the fin type active pattern on a trimmed first part;
    forming a gate spacer formed on sidewalls of the dummy gate electrode and a trimmed second part;
    forming a recess in a trimmed third part using the dummy gate electrode as a mask; and
    forming a source/drain filling the recess on the trimmed third part wherein the trimmed first part has a greater width than the trimmed second part at a first height from the top surface of the field insulation layer.

11. The method of claim 10, wherein the trimming reduces heights and widths of the second part and the third part.

12. The method of claim 10, wherein the source/drain is epitaxially grown, using the fin type active pattern as a seed.

13. The method of claim 10, wherein the trimmed first part, the trimmed second part and the trimmed third part have the same width at a boundary between the field insulation layer and the fin type active pattern.

* * * * *